US012648308B2

(12) United States Patent (10) Patent No.: US 12,648,308 B2
Shiomi (45) Date of Patent: Jun. 2, 2026

(54) DISPLAY DEVICE

(71) Applicant: Magnolia White Corporation, Tokyo (JP)

(72) Inventor: Naoki Shiomi, Tokyo (JP)

(73) Assignee: MAGNOLIA WHITE CORPORATION, Tokyo (JP)

( * ) Notice: Subject to any disclaimer, the term of this patent is extended or adjusted under 35 U.S.C. 154(b) by 478 days.

(21) Appl. No.: 18/450,443

(22) Filed: Aug. 16, 2023

(65) Prior Publication Data

US 2024/0065040 A1 Feb. 22, 2024

(30) Foreign Application Priority Data

Aug. 19, 2022 (JP) ................................. 2022-131125

(51) Int. Cl.
| | |
|---|---|
| *H10K 59/122* | (2023.01) |
| *H10K 59/80* | (2023.01) |
| *H10K 59/12* | (2023.01) |
| *H10K 102/00* | (2023.01) |
| *H10K 102/10* | (2023.01) |

(52) U.S. Cl.
CPC ..... *H10K 59/122* (2023.02); *H10K 59/80518* (2023.02); *H10K 59/80524* (2023.02); *H10K 59/871* (2023.02); *H10K 59/1201* (2023.02); *H10K 2102/103* (2023.02); *H10K 2102/351* (2023.02)

(58) Field of Classification Search
CPC ......... H10K 59/122; H10K 2102/3026; H10K 59/80524; H10K 59/30; H10K 59/35; H10K 59/351
See application file for complete search history.

(56) References Cited

U.S. PATENT DOCUMENTS

| | | | |
|---|---|---|---|
| 2004/0160170 A1 | 8/2004 | Sato et al. | |
| 2009/0009069 A1 | 1/2009 | Takata | |
| 2019/0363275 A1 | 11/2019 | Ochi et al. | |
| 2020/0328263 A1* | 10/2020 | Choi .................... | H10K 50/115 |
| 2022/0077251 A1 | 3/2022 | Choung et al. | |

FOREIGN PATENT DOCUMENTS

| | | |
|---|---|---|
| JP | 2000-195677 A | 7/2000 |
| JP | 2004-207217 A | 7/2004 |
| JP | 2008-135325 A | 6/2008 |
| JP | 2009-032673 A | 2/2009 |
| JP | 2010-118191 A | 5/2010 |
| WO | 2018/179308 A1 | 10/2018 |

* cited by examiner

*Primary Examiner* — John A Bodnar
(74) *Attorney, Agent, or Firm* — XSENSUS LLP

(57) ABSTRACT

According to one embodiment, a display device includes first and second lower electrodes, a rib including first and second pixel apertures, a first organic layer, a second organic layer, a first upper electrode, a second upper electrode, and a partition including a lower portion and an upper portion. The partition includes first and second portions. A first height from an upper surface of the first lower electrode overlapping the first pixel aperture to an upper surface of the first portion is different from a second height from an upper surface of the second lower electrode overlapping the second pixel aperture to an upper surface of the second portion.

19 Claims, 25 Drawing Sheets

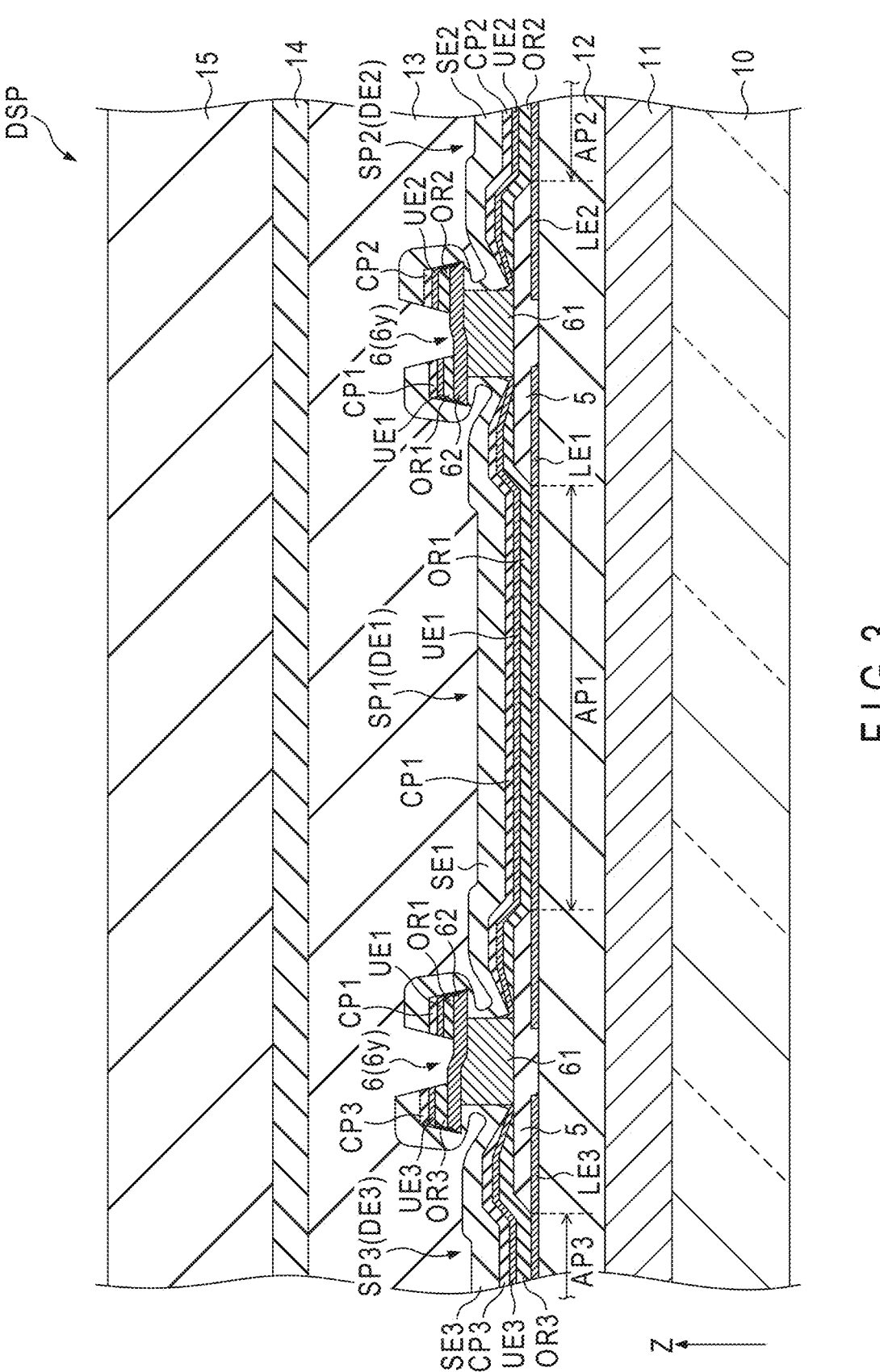
F I G. 3

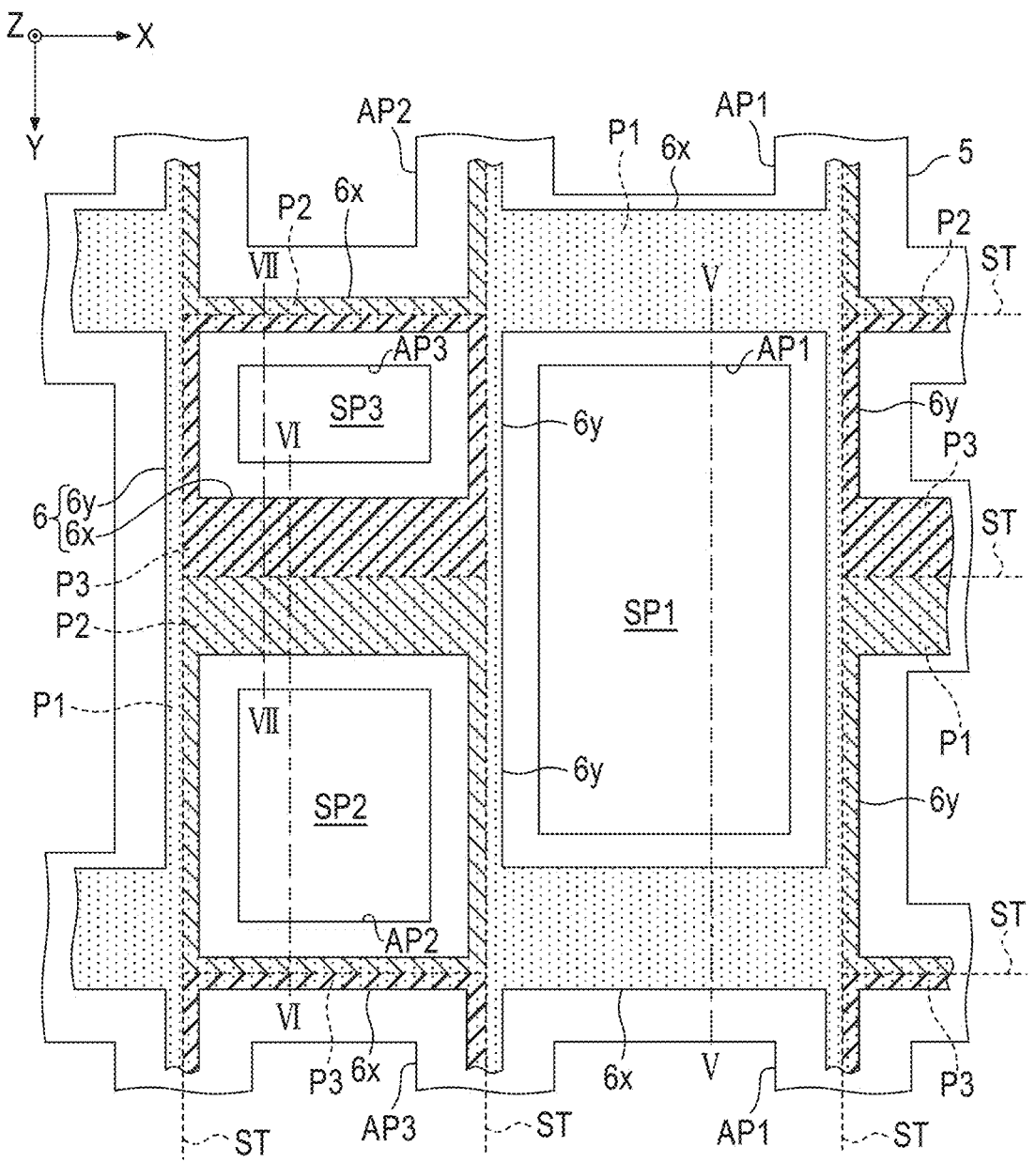
F I G. 4

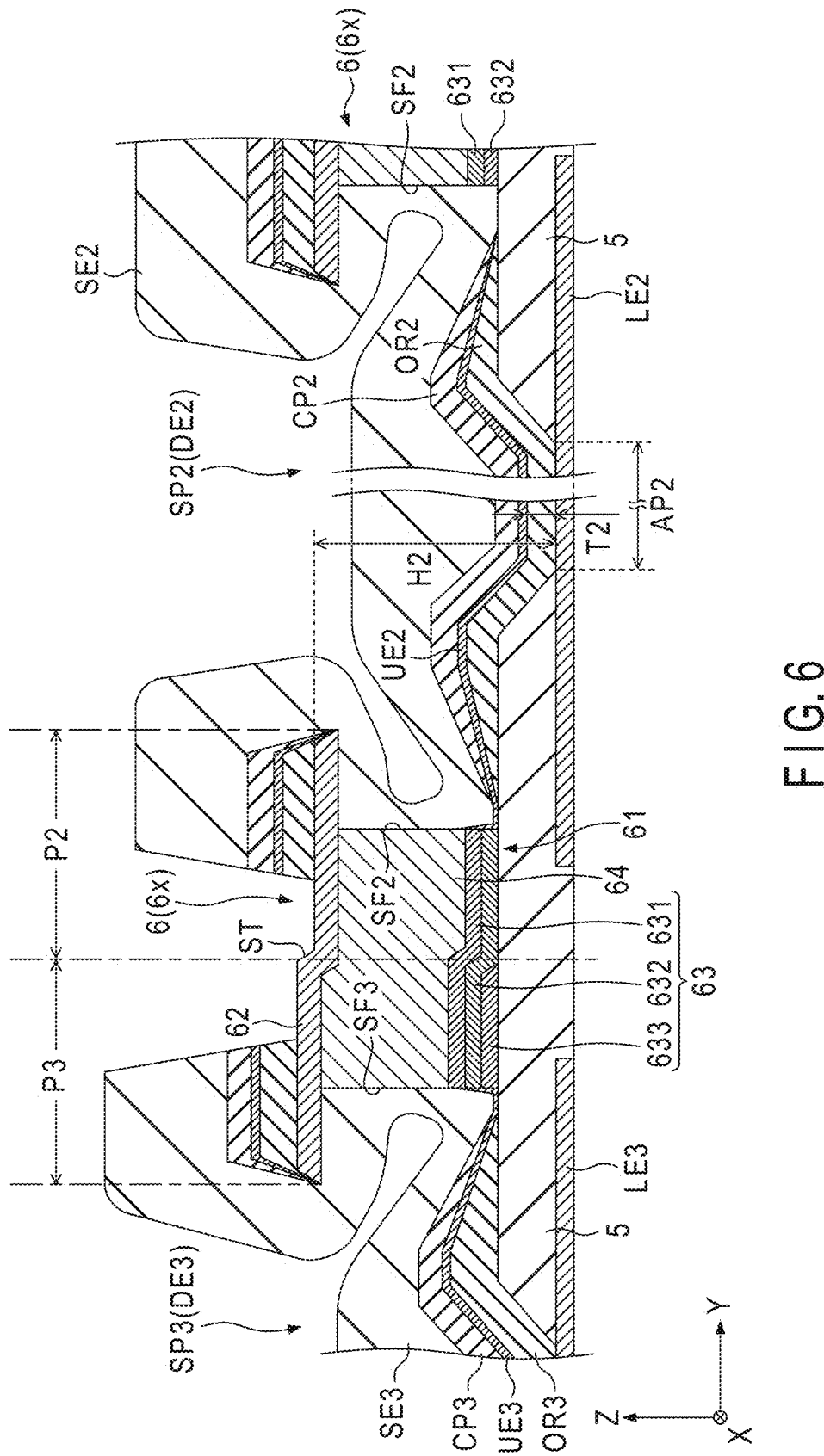
F I G. 6

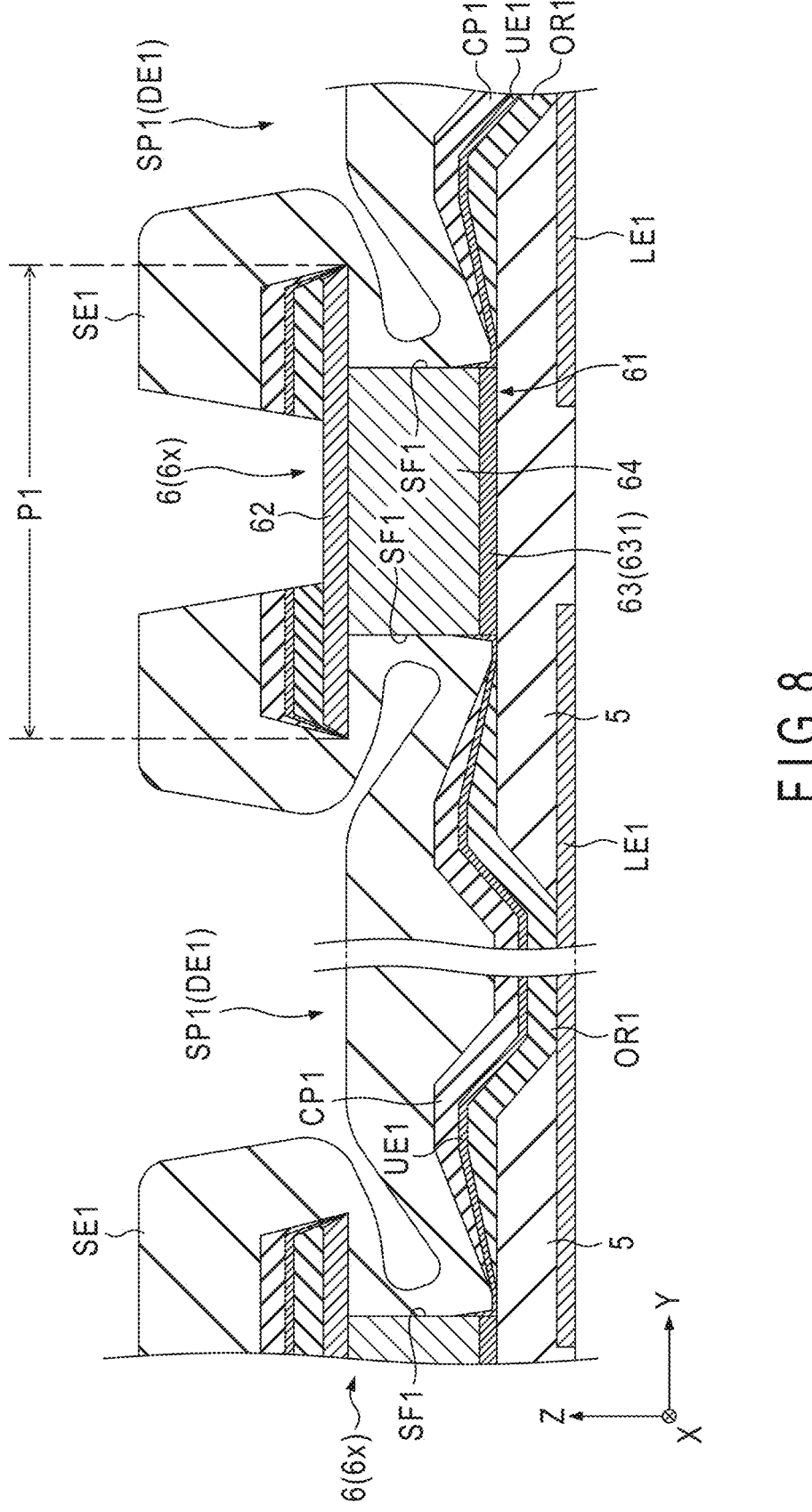
F I G. 8

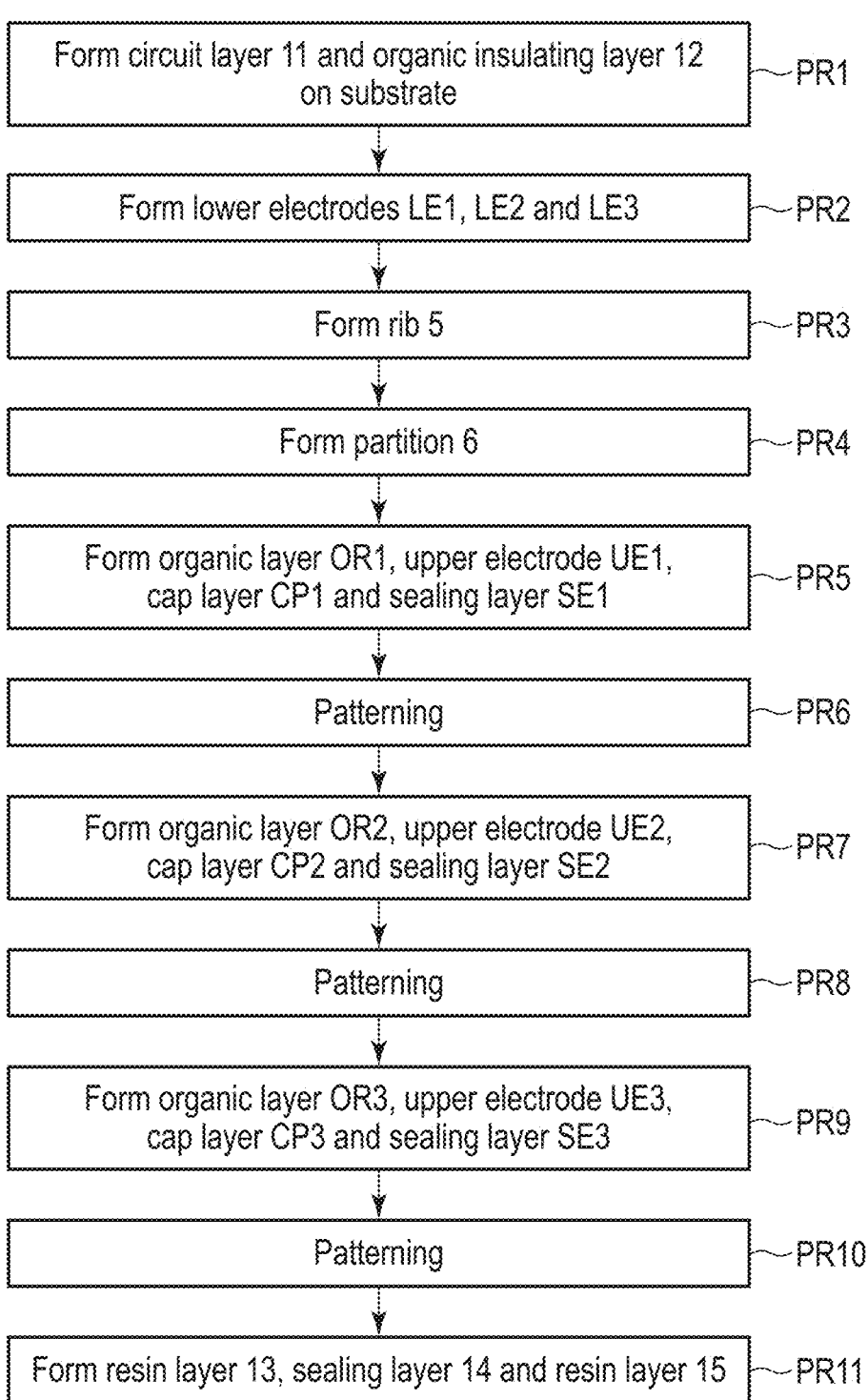

Form circuit layer 11 and organic insulating layer 12 on substrate ~PR1

Form lower electrodes LE1, LE2 and LE3 ~PR2

Form rib 5 ~PR3

Form partition 6 ~PR4

Form organic layer OR1, upper electrode UE1, cap layer CP1 and sealing layer SE1 ~PR5

Patterning ~PR6

Form organic layer OR2, upper electrode UE2, cap layer CP2 and sealing layer SE2 ~PR7

Patterning ~PR8

Form organic layer OR3, upper electrode UE3, cap layer CP3 and sealing layer SE3 ~PR9

Patterning ~PR10

Form resin layer 13, sealing layer 14 and resin layer 15 ~PR11

F I G. 9

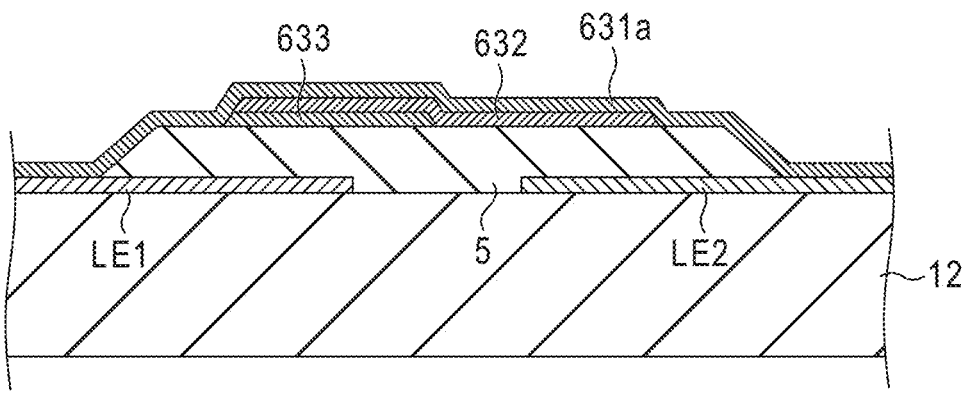
F I G. 13
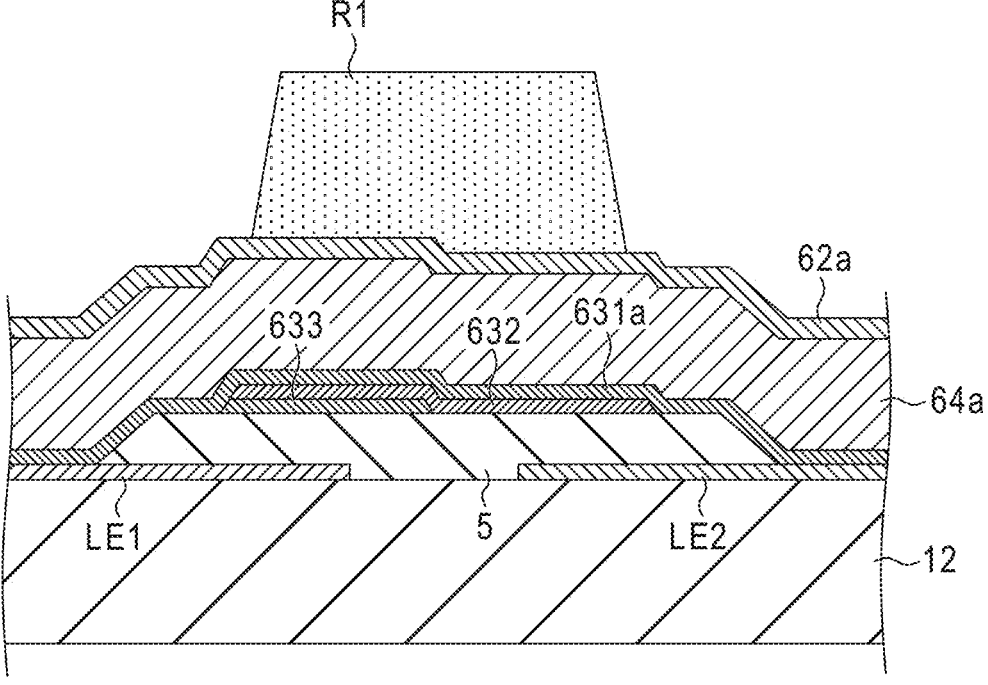
F I G. 14

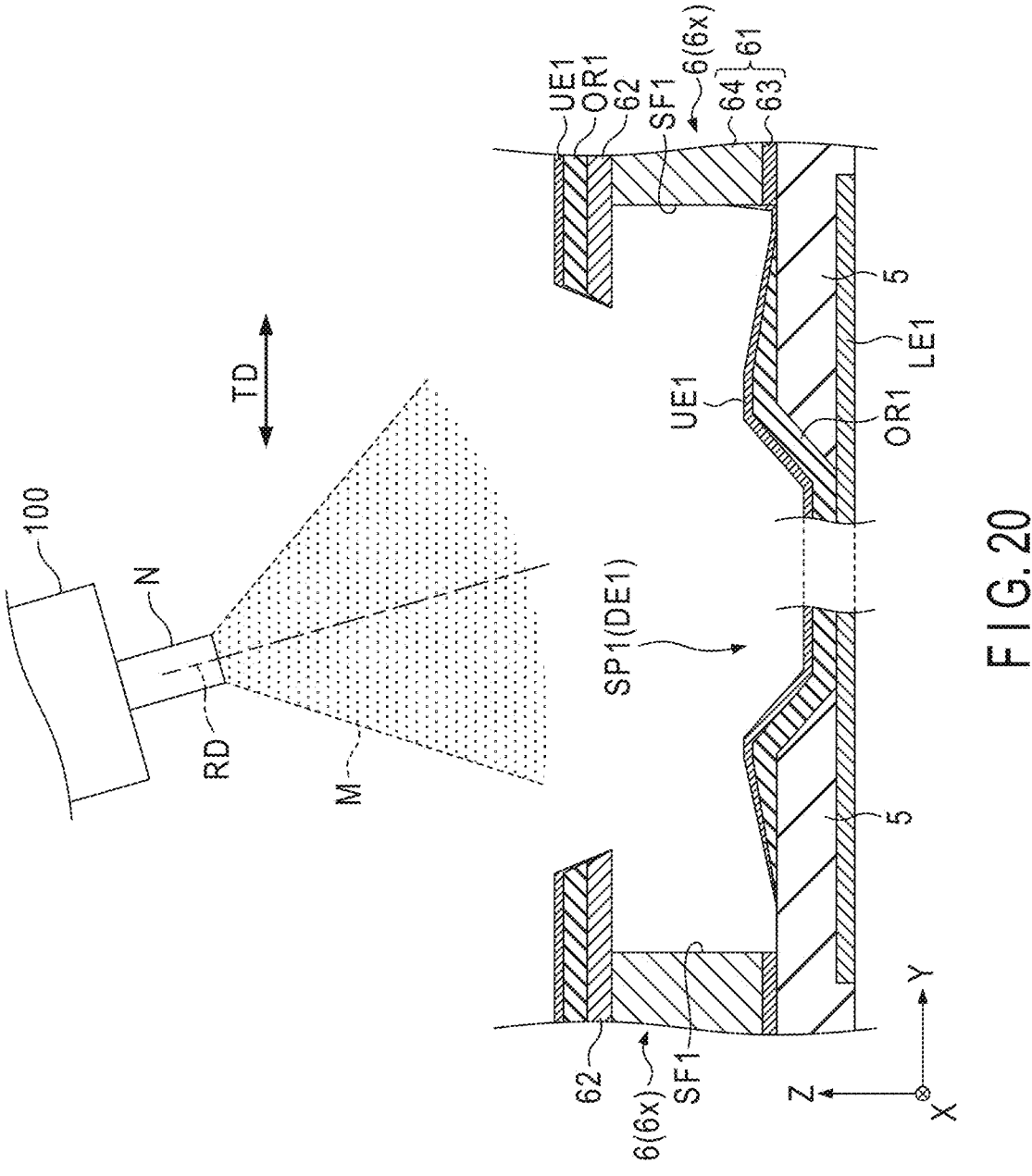
F I G. 20

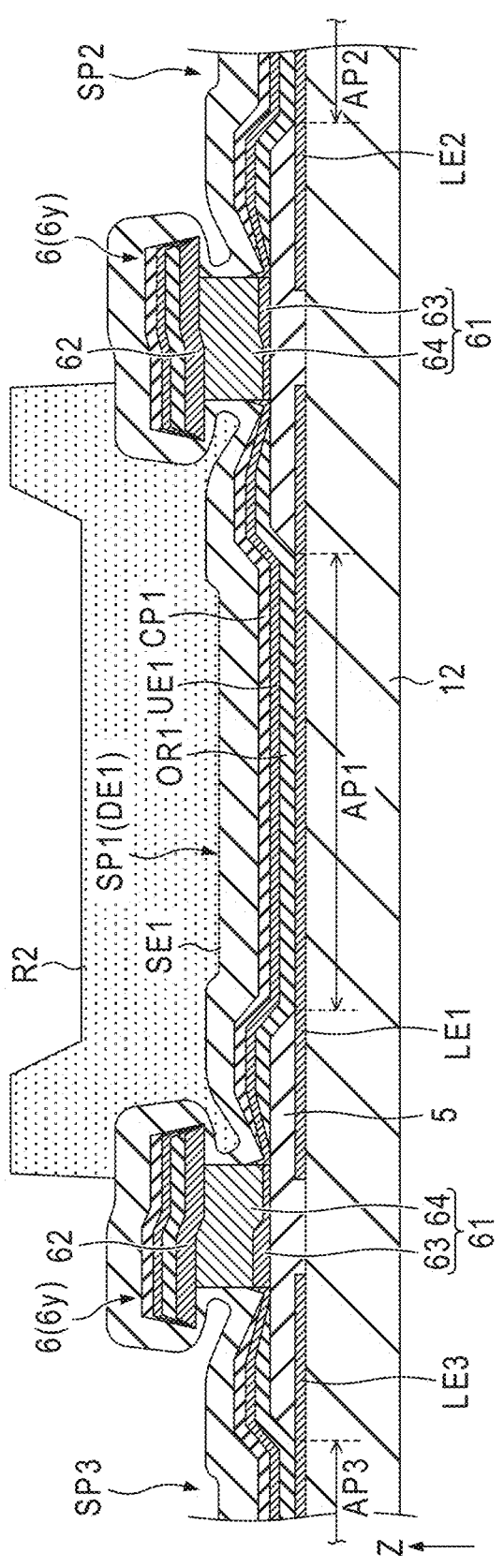
F I G. 21

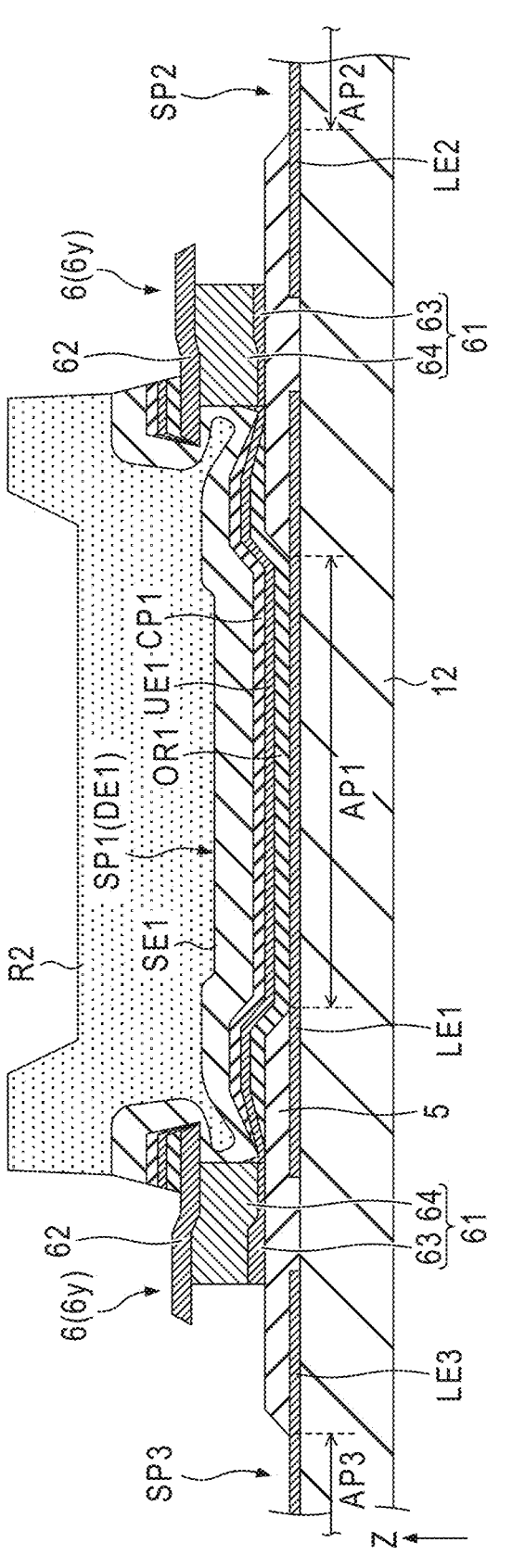
F I G. 22

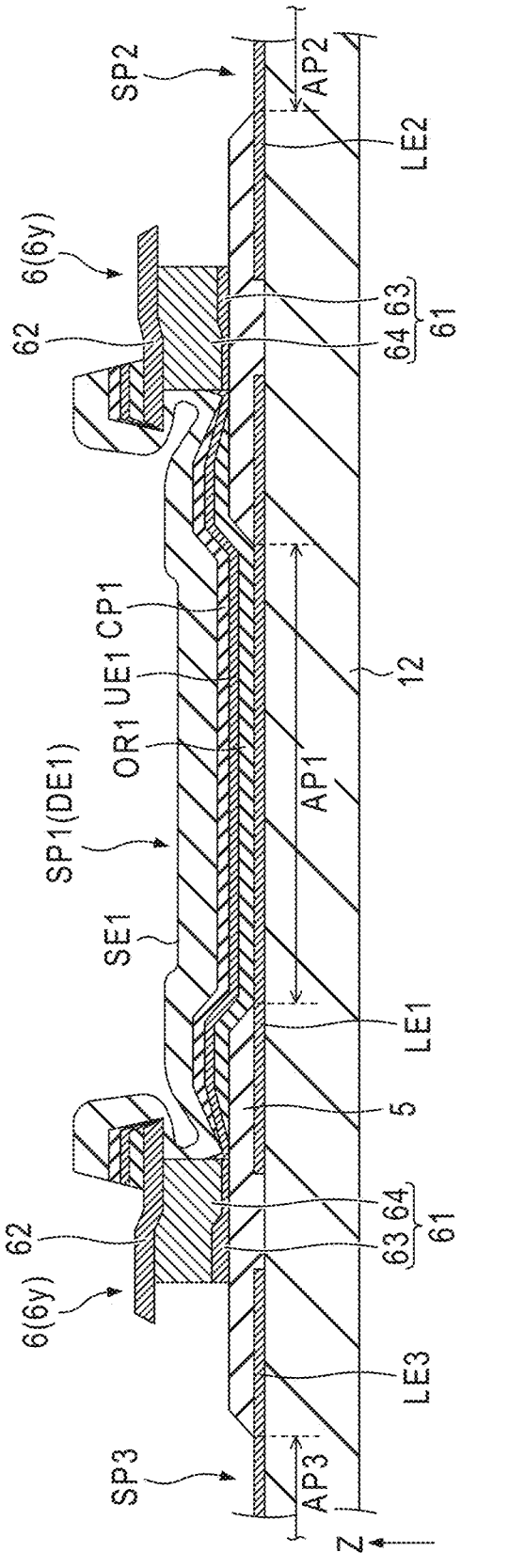
F I G. 23

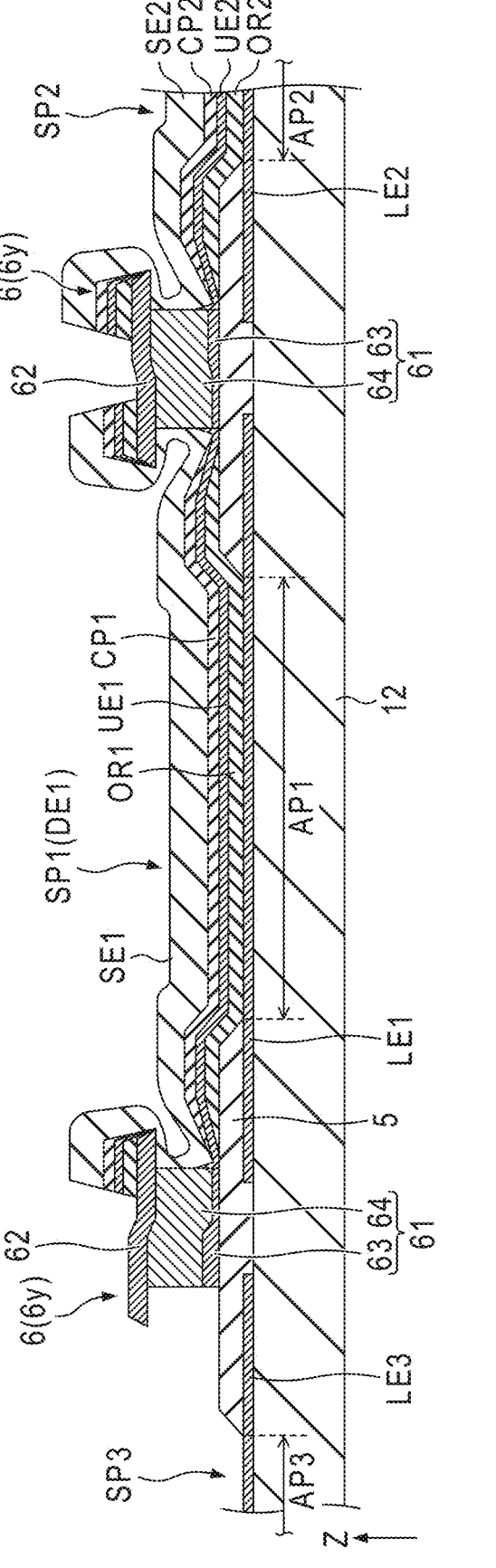
F I G. 24

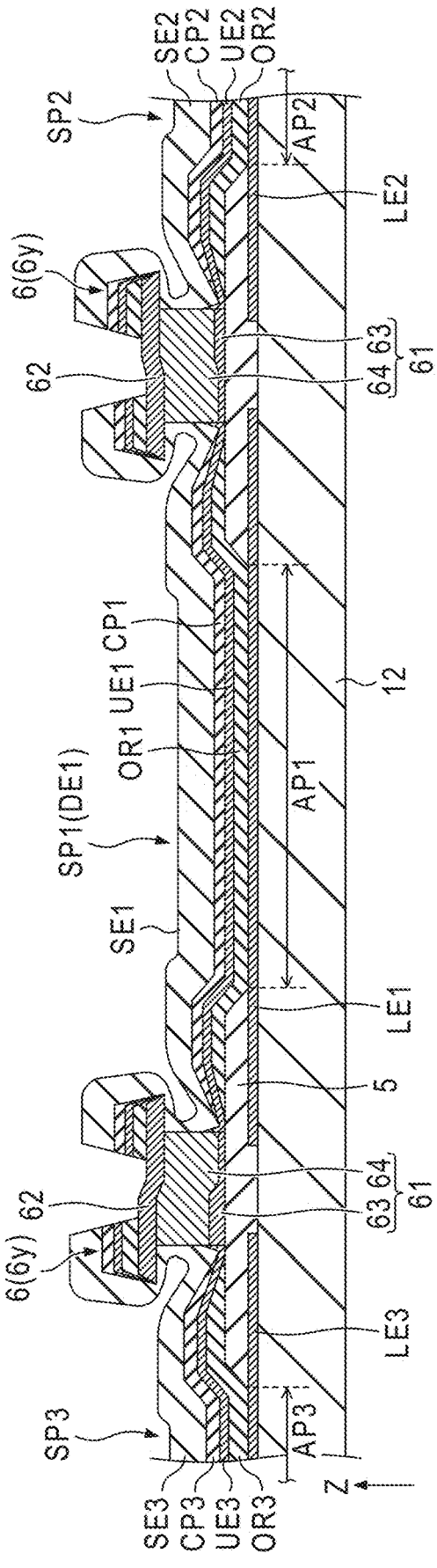
F I G. 25

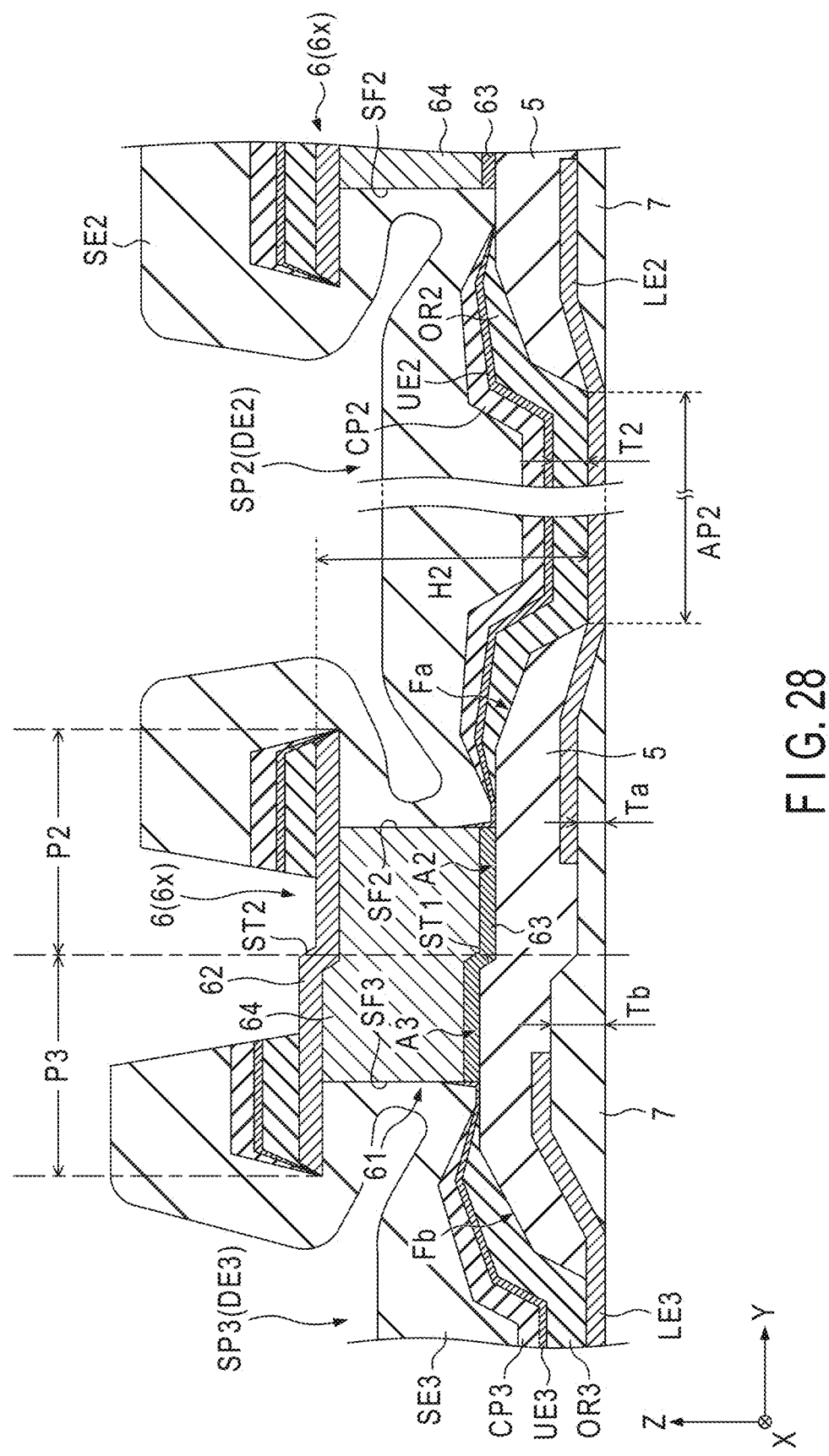
F I G. 28

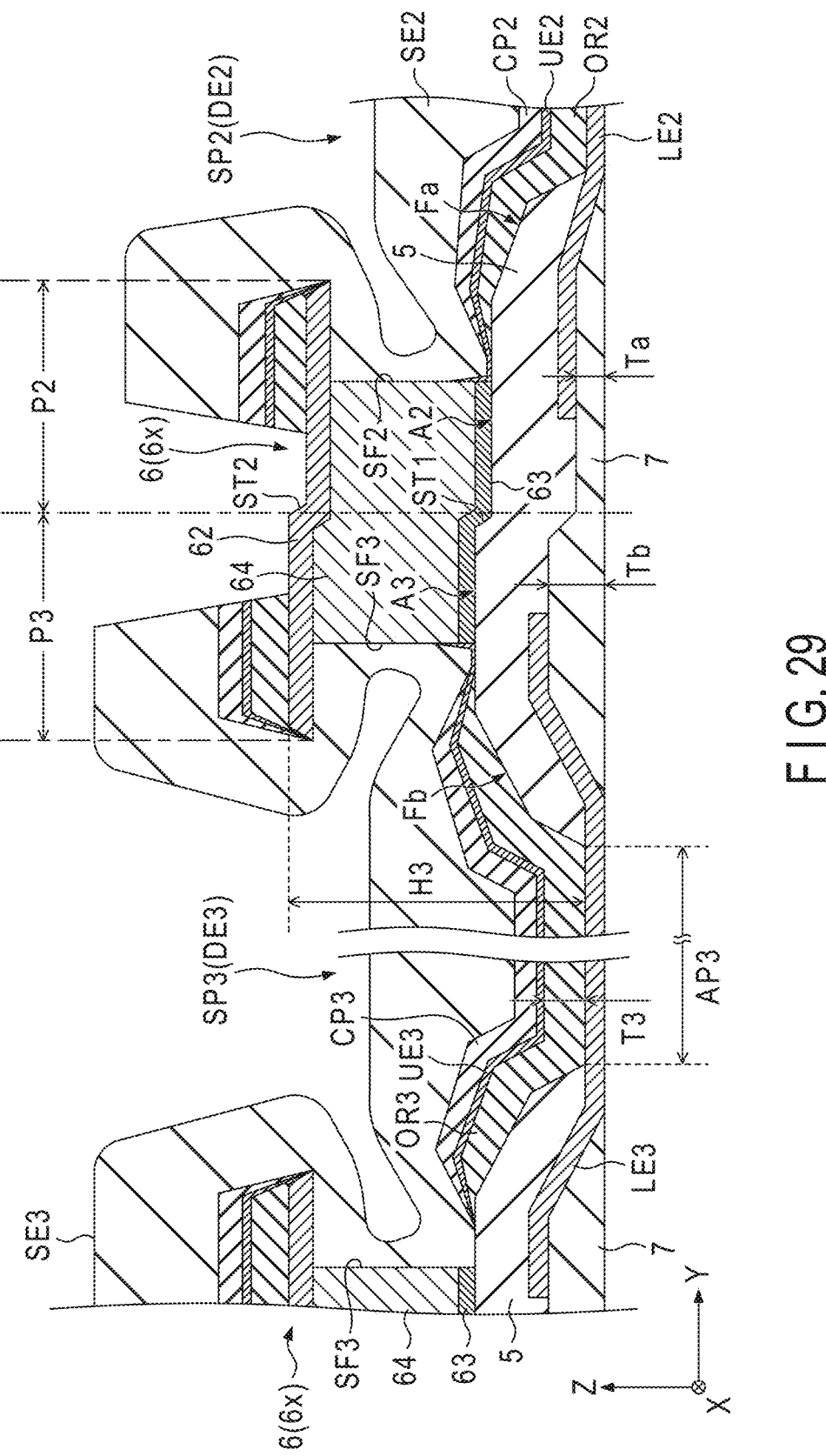
F I G. 29

DISPLAY DEVICE

CROSS-REFERENCE TO RELATED APPLICATIONS

This application is based upon and claims the benefit of priority from Japanese Patent Application No. 2022-131125, filed Aug. 19, 2022, the entire contents of which are incorporated herein by reference.

FIELD

Embodiments described herein relate generally to a display device.

BACKGROUND

Recently, display devices to which an organic light emitting diode (OLED) is applied as a display element have been put into practical use. This display element comprises a lower electrode, an organic layer which covers the lower electrode, and an upper electrode which covers the organic layer.

When such a display device is manufactured, a technique which improves the yield of the manufacturing process is required.

BRIEF DESCRIPTION OF THE DRAWINGS

FIG. 3 is a schematic cross-sectional view of the display device along the III-III line of FIG. 2.

FIG. 4 is a schematic plan view of a rib and a partition.

FIG. 6 is a schematic cross-sectional view of the display device along the VI-VI line of FIG. 4.

FIG. 8 is a schematic cross-sectional view showing another example of a structure which could be applied to a subpixel.

FIG. 9 is a flowchart showing an example of the manufacturing method of the display device.

FIG. 13 is a schematic cross-sectional view showing a manufacturing process following FIG. 12.

FIG. 14 is a schematic cross-sectional view showing a manufacturing process following FIG. 13.

FIG. 20 is a schematic diagram showing the evaporation method of an upper electrode, etc.

FIG. 21 is a schematic cross-sectional view showing a manufacturing process following FIG. 19.

FIG. 22 is a schematic cross-sectional view showing a manufacturing process following FIG. 21.

FIG. 23 is a schematic cross-sectional view showing a manufacturing process following FIG. 22.

FIG. 24 is a schematic cross-sectional view showing a manufacturing process following FIG. 23.

FIG. 25 is a schematic cross-sectional view showing a manufacturing process following FIG. 24.

FIG. 28 is another schematic cross-sectional view showing a subpixel and the partition around the subpixel according to the second embodiment.

FIG. 29 is yet another schematic cross-sectional view showing a subpixel and the partition around the subpixel according to the second embodiment.

DETAILED DESCRIPTION

Figure 1:
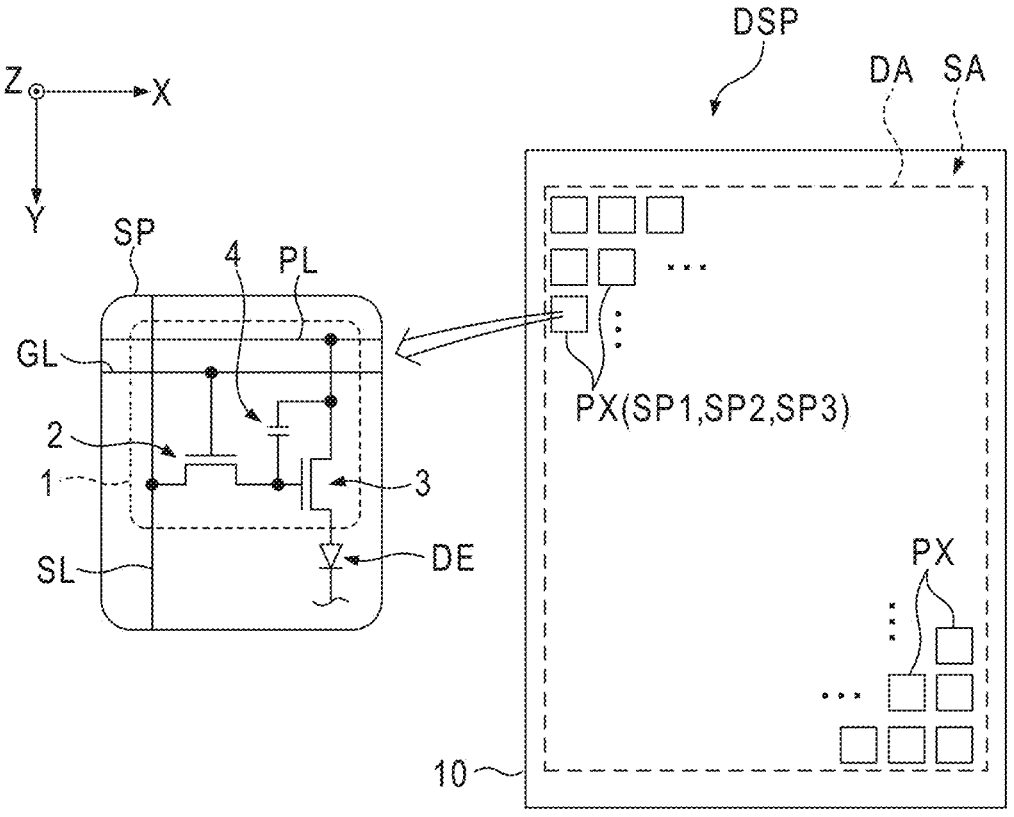
FIG. 1 is a diagram showing a configuration example of a display device according to a first embodiment.

In general, according to one embodiment, a display device comprises a first lower electrode, a second lower electrode, a rib comprising a first pixel aperture which overlaps the first lower electrode, and a second pixel aperture which overlaps the second lower electrode, a first organic layer which covers the first lower electrode through the first pixel aperture and emits light based on application of voltage, a second organic layer which covers the second lower electrode through the second pixel aperture and emits light based application of voltage, a first upper electrode which covers the first organic layer, a second upper electrode which covers the second organic layer, and a partition including a lower portion which is provided on the rib between the first pixel aperture and the second pixel aperture, and an upper portion which protrudes from a side surface of the lower portion. The partition comprises a first portion on the first pixel aperture side, and a second portion on the second pixel aperture side. Further, a first height from an upper surface of the first lower electrode overlapping the first pixel aperture to an upper surface of the first portion is different from a second height from an upper surface of the second lower electrode overlapping the second pixel aperture to an upper surface of the second portion.

This configuration can improve the yield of the manufacturing process of a display device.

Embodiments will be described with reference to the accompanying drawings.

The disclosure is merely an example, and proper changes in keeping with the spirit of the invention, which are easily conceivable by a person of ordinary skill in the art, come within the scope of the invention as a matter of course. In addition, in some cases, in order to make the description clearer, the widths, thicknesses, shapes, etc., of the respective parts are illustrated schematically in the drawings, rather than as an accurate representation of what is implemented. However, such schematic illustration is merely exemplary, and in no way restricts the interpretation of the invention. In addition, in the specification and drawings, structural elements which function in the same or a similar manner to those described in connection with preceding drawings are denoted by like reference numbers, detailed description thereof being omitted unless necessary.

In the drawings, in order to facilitate understanding, an X-axis, a Y-axis and a Z-axis orthogonal to each other are shown depending on the need. A direction parallel to the X-axis is referred to as a first direction X. A direction parallel to the Y-axis is referred to as a second direction Y. A direction parallel to the Z-axis is referred to as a third direction Z. When various types of elements are viewed parallel to the third direction Z, the appearance is defined as plan view.

The display device of each embodiment is an organic electroluminescent display device comprising an organic light emitting diode (OLED) as a display element, and could be mounted on a television, a personal computer, a vehicle-mounted device, a tablet, a smartphone, a mobile phone, etc.

First Embodiment

FIG. 1 is a diagram showing a configuration example of a display device DSP according to a first embodiment. The display device DSP comprises a display area DA which displays an image and a surrounding area SA around the display area DA on an insulating substrate 10. The substrate 10 may be glass or a resinous film having flexibility.

In the present embodiment, the substrate 10 is rectangular as seen in plan view. It should be noted that the shape of the substrate 10 in plan view is not limited to a rectangular shape and may be another shape such as a square shape, a circular shape or an elliptic shape.

The display area DA comprises a plurality of pixels PX arrayed in matrix in a first direction X and a second direction Y. Each pixel PX includes a plurality of subpixels SP. For example, each pixel PX includes a blue subpixel SP1, a green subpixel SP2 and a red subpixel SP3. Each pixel PX may include a subpixel SP which exhibits another color such as white in addition to subpixels SP1, SP2 and SP3 or instead of one of subpixels SP1, SP2 and SP3.

Each subpixel SP comprises a pixel circuit 1 and a display element DE driven by the pixel circuit 1. The pixel circuit 1 comprises a pixel switch 2, a drive transistor 3 and a capacitor 4. The pixel switch 2 and the drive transistor 3 are, for example, switching elements consisting of thin-film transistors.

The gate electrode of the pixel switch 2 is connected to a scanning line GL. One of the source electrode and drain electrode of the pixel switch 2 is connected to a signal line SL. The other one is connected to the gate electrode of the drive transistor 3 and the capacitor 4. In the drive transistor 3, one of the source electrode and the drain electrode is connected to a power line PL and the capacitor 4, and the other one is connected to the display element DE. The display element DE is an organic light emitting diode (OLED) as a light emitting element.

Figure 2:
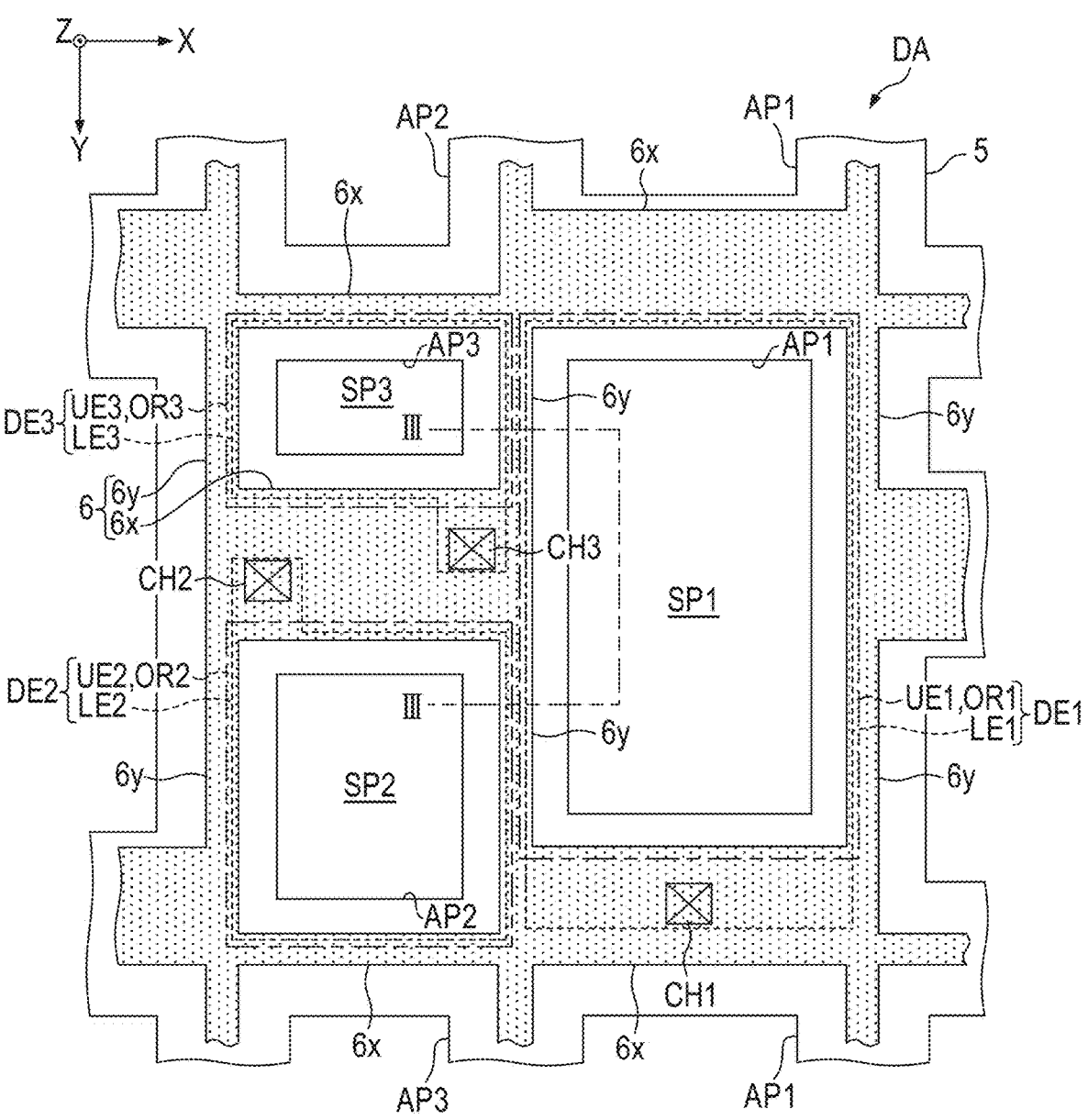
FIG. 2 is a diagram showing an example of the layout of subpixels.

It should be noted that the configuration of the pixel circuit 1 is not limited to the example shown in the figure. For example, the pixel circuit 1 may comprise more thin-film transistors and capacitors. FIG. 2 is a diagram showing an example of the layout of subpixels SP1, SP2 and SP3. In the example of FIG. 2, subpixels SP1 and SP2 are arranged in the first direction X. Subpixels SP1 and SP3 are also arranged in the first direction X. Further, subpixels SP2 and SP3 are arranged in the second direction Y.

When subpixels SP1, SP2 and SP3 are provided in line with this layout, in the display area DA, a column in which subpixels SP2 and SP3 are alternately provided in the second direction Y and a column in which a plurality of subpixels SP1 are repeatedly provided in the second direction Y are formed. These columns are alternately arranged in the first direction X.

It should be noted that the layout of subpixels SP1, SP2 and SP3 is not limited to the example of FIG. 2. As another example, subpixels SP1, SP2 and SP3 in each pixel PX may be arranged in order in the first direction X.

A rib 5 and a partition 6 are provided in the display area DA. The rib 5 comprises a pixel aperture AP1 in subpixel SP1, comprises a pixel aperture AP2 in subpixel SP2 and comprises a pixel aperture AP3 in subpixel SP3.

In the example of FIG. 2, the area of the pixel aperture AP1 is greater than that of the pixel aperture AP2. The area of the pixel aperture AP1 is greater than that of the pixel aperture AP3. Further, the area of the pixel aperture AP3 is less than that of the pixel aperture AP2.

The partition 6 is provided in the boundary between adjacent subpixels SP and overlaps the rib 5 as seen in plan view. The partition 6 comprises a plurality of first partitions 6x extending in the first direction X and a plurality of second partitions 6y extending in the second direction Y. The first partitions 6x are provided between the pixel apertures AP2 and AP3 which are adjacent to each other in the second direction Y and between two pixel apertures AP1 which are adjacent to each other in the second direction Y. Each second partition 6y is provided between the pixel apertures AP1 and AP2 which are adjacent to each other in the first direction X and between the pixel apertures AP1 and AP3 which are adjacent to each other in the first direction X.

In the example of FIG. 2, the first partitions 6x and the second partitions 6y are connected to each other. In this configuration, the partition 6 has a grating shape surrounding the pixel apertures AP1, AP2 and AP3 as a whole. In other words, the partition 6 comprises apertures in subpixels SP1, SP2 and SP3 in a manner similar to that of the rib 5.

Subpixel SP1 comprises a lower electrode LE1, an upper electrode UE1 and an organic layer OR1 overlapping the pixel aperture AP1. Subpixel SP2 comprises a lower electrode LE2, an upper electrode UE2 and an organic layer OR2 overlapping the pixel aperture AP2. Subpixel SP3 comprises a lower electrode LE3, an upper electrode UE3 and an organic layer OR3 overlapping the pixel aperture AP3.

The lower electrode LE1, the upper electrode UE1 and the organic layer OR1 constitute the display element DE1 of subpixel SP1. The lower electrode LE2, the upper electrode UE2 and the organic layer OR2 constitute the display element DE2 of subpixel SP2. The lower electrode LE3, the upper electrode UE3 and the organic layer OR3 constitute the display element DE3 of subpixel SP3. Each of the display elements DE1, DE2 and DE3 may include a cap layer as described later.

The lower electrode LE1 is connected to the pixel circuit 1 (see FIG. 1) of subpixel SP1 through a contact hole CH1. The lower electrode LE2 is connected to the pixel circuit 1 of subpixel SP2 through a contact hole CH2. The lower electrode LE3 is connected to the pixel circuit 1 of subpixel SP3 through a contact hole CH3.

In the example of FIG. 2, the contact holes CH2 and CH3 entirely overlap the first partition 6X between the pixel apertures AP2 and AP3 which are adjacent to each other in the second direction Y. The contact hole CH1 entirely overlaps the first partition 6x between two pixel apertures AP1 which are adjacent to each other in the second direction Y. As another example, at least part of the contact hole CH1, CH2 or CH3 may not overlap the first partition 6x.

FIG. 3 is a schematic cross-sectional view of the display device DSP along the III-III line of FIG. 2. A circuit layer 11 is provided on the substrate 10 described above. The circuit layer 11 includes various circuits and lines such as the pixel circuit 1, scanning line GL, signal line SL and power line PL shown in FIG. 1.

The circuit layer 11 is covered with an organic insulating layer 12. The organic insulating layer 12 functions as a planarization film which planarizes the irregularities formed by the circuit layer 11. Although not shown in the section of FIG. 3, all of the contact holes CH1, CH2 and CH3 described above are provided in the organic insulating layer 12.

The lower electrodes LE1, LE2 and LE3 are provided on the organic insulating layer 12. The rib 5 is provided on the organic insulating layer 12 and the lower electrodes LE1, LE2 and LE3. The end portions of the lower electrodes LE1, LE2 and LE3 are covered with the rib 5.

The partition 6 includes a conductive lower portion 61 provided on the rib 5 and an upper portion 62 provided on the lower portion 61. The upper portion 62 has a width greater than that of the lower portion 61. By this configuration, in FIG. 3, the both end portions of the upper portion 62 protrude relative to the side surfaces of the lower portion 61. This shape of the partition 6 is called an overhang shape.

The organic layer OR1 covers the lower electrode LE1 through the pixel aperture AP1. The upper electrode UE1 covers the organic layer OR1 and faces the lower electrode LE1. The organic layer OR2 covers the lower electrode LE2 through the pixel aperture AP2. The upper electrode UE2 covers the organic layer OR2 and faces the lower electrode LE2. The organic layer OR3 covers the lower electrode LE3 through the pixel aperture AP3. The upper electrode UE3 covers the organic layer OR3 and faces the lower electrode LE3.

In the example of FIG. 3, cap layers CP1, CP2 and CP3 are provided in subpixels SP1, SP2 and SP3, respectively. The cap layer CP1 covers the upper electrode UE1. The cap layer CP2 covers the upper electrode UE2. The cap layer CP3 covers the upper electrode UE3.

Further, sealing layers SE1, SE2 and SE3 are provided in subpixels SP1, SP2 and SP3, respectively. The sealing layer SE1 continuously covers, of the partition 6 surrounding subpixel SP1, a portion which is close to subpixel SP1, and the cap layer CP1. The sealing layer SE2 continuously covers, of the partition 6 surrounding subpixel SP2, a portion which is close to subpixel SP2, and the cap layer CP2. The sealing layer SE3 continuously covers, of the partition 6 surrounding subpixel SP3, a portion which is close to subpixel SP3, and the cap layer CP3.

The organic layer OR1, the upper electrode UE1 and the cap layer CP1 are partly located on the upper portion 62. These portions are spaced apart from, of the organic layer OR1, the upper electrode UE1 and the cap layer CP1, the portions located on the rib 5. Similarly, the organic layer OR2, the upper electrode UE2 and the cap layer CP2 are partly located on the upper portion 62, and these portions are spaced apart from, of the organic layer OR2, the upper electrode UE2 and the cap layer CP2, the portions located on the rib 5. Further, the organic layer OR3, the upper electrode UE3 and the cap layer CP3 are partly located on the upper portion 62, and these portions are spaced apart from, of the organic layer OR3, the upper electrode UE3 and the cap layer CP3, the portions located on the rib 5.

In the example of FIG. 3, the organic layer OR1, the upper electrode UE1, the cap layer CP1 and the sealing layer SE1 on the partition 6 between subpixels SP1 and SP2 are spaced apart from the organic layer OR2, the upper electrode UE2, the cap layer CP2 and the sealing layer SE2 on this partition 6. The organic layer OR1, the upper electrode UE1, the cap layer CP1 and the sealing layer SE1 on the partition 6 between subpixels SP1 and SP3 are spaced apart from the organic layer OR3, the upper electrode UE3, the cap layer CP3 and the sealing layer SE3 on this partition 6.

The sealing layers SE1, SE2 and SE3 are covered with a resin layer 13. The resin layer 13 is covered with a sealing layer 14. Further, the sealing layer 14 is covered with a resin layer 15.

Each of the organic insulating layer 12 and the resin layers 13 and 15 is formed of an organic material. Each of the rib 5, the sealing layers SE1, SE2 and SE3 and the sealing layer 14 is formed of, for example, an inorganic material such as silicon nitride (SiNx), silicon oxide (SiOx) or silicon oxynitride (SiON).

Each of the lower electrodes LE1, LE2 and LE3 comprises an intermediate layer formed of, for example, silver (Ag), and a pair of conductive oxide layers covering the upper and lower surfaces of the intermediate layer. Each conductive oxide layer may be formed of, for example, a transparent conductive oxide such as indium tin oxide (ITO), indium zinc oxide (IZO) or indium gallium zinc oxide (IGZO).

For example, each of the organic layers OR1, OR2 and OR3 comprises a multilayer structure consisting of a hole injection layer, a hole transport layer, an electron blocking layer, a light emitting layer, a hole blocking layer, an electron transport layer and an electron injection layer. Each of the organic layers OR1, OR2 and OR3 may include a plurality of light emitting layers.

Each of the upper electrodes UE1, UE2 and UE3 is formed of, for example, a metal material such as an alloy of magnesium and silver (MgAg). For example, the lower electrodes LE1, LE2 and LE3 correspond to the anodes of the display elements DE1, DE2 and DE3, respectively. The upper electrodes UE1, UE2 and UE3 correspond to the cathodes of the display elements DE1, DE2 and DE3, respectively.

Each of the cap layers CP1, CP2 and CP3 is formed of, for example, a multilayer body of a plurality of transparent thin films. As the thin films, the multilayer body may include a thin film formed of an inorganic material and a thin film formed of an organic material. These thin films have refractive indices different from each other. The materials of the thin films constituting the multilayer body are different from the materials of the upper electrodes UE1, UE2 and UE3 and are also different from the materials of the sealing layers SE1, SE2 and SE3. It should be noted that the cap layers CP1, CP2 and CP3 may be omitted.

Common voltage is applied to the partition 6. This common voltage is applied to each of the upper electrodes UE1, UE2 and UE3 which are in contact with the side surfaces of the lower portions 61. Pixel voltage is applied to the lower electrodes LE1, LE2 and LE3 through the pixel circuits 1 provided in subpixels SP1, SP2 and SP3, respectively.

The organic layers OR1, OR2 and OR3 emit light based on the application of voltage. Specifically, when a potential difference is formed between the lower electrode LE1 and the upper electrode UE1, the light emitting layer of the organic layer OR1 emits light in a blue wavelength range. When a potential difference is formed between the lower electrode LE2 and the upper electrode UE2, the light emitting layer of the organic layer OR2 emits light in a green wavelength range. When a potential difference is formed between the lower electrode LE3 and the upper electrode UE3, the light emitting layer of the organic layer OR3 emits light in a red wavelength range.

FIG. 4 is a schematic plan view of the rib 5 and the partition 6. In the present embodiment, the partition 6 comprises a first portion P1 (the dotted portion), a second portion P2 (the portion shown by rising diagonal strokes from bottom right to top left), and a third portion P3 (the portion shown by rising diagonal strokes from bottom left to top right). The first portion P1, the second portion P2 and the third portion P3 have different heights. The first portion P1 surrounds the pixel aperture AP1. The second portion P2 surrounds the pixel aperture AP2. The third portion P3 surrounds the pixel aperture AP3.

In the example of FIG. 4, the first portion P1 consists of the entire first partitions 6x which are adjacent to the pixel aperture AP1, and half of each of the second partitions 6y which are adjacent to the pixel aperture AP1 on the pixel aperture AP1 side. The second portion P2 consists of half of each of the first partitions 6x which are adjacent to the pixel aperture AP2 on the pixel aperture AP2 side, and half of each of the second partitions 6y which are adjacent to the pixel aperture AP2 on the pixel aperture AP2 side. The third portion P3 consists of half of each of the first partitions 6x which are adjacent to the pixel aperture AP3 on the pixel aperture AP3 side, and half of each of the second partitions 6y which are adjacent to the pixel aperture AP3 on the pixel aperture AP3 side. In the boundaries of the first, second and third portions P1, P2 and P3, the steps ST described later are formed in the upper portions 62.

Figure 5:
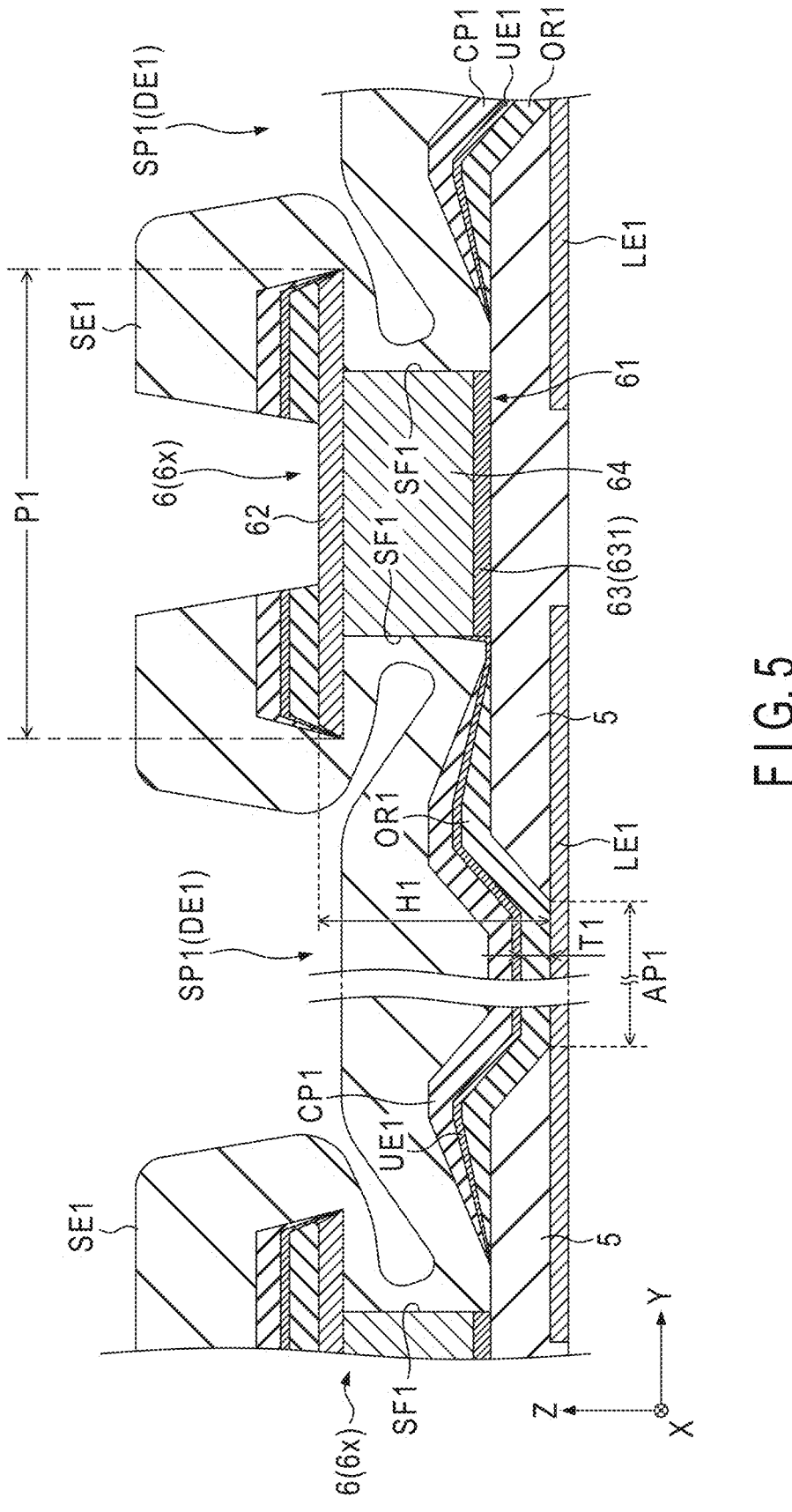
FIG. 5 is a schematic cross-sectional view of the display device along the V-V line of FIG. 4.
Figure 7:
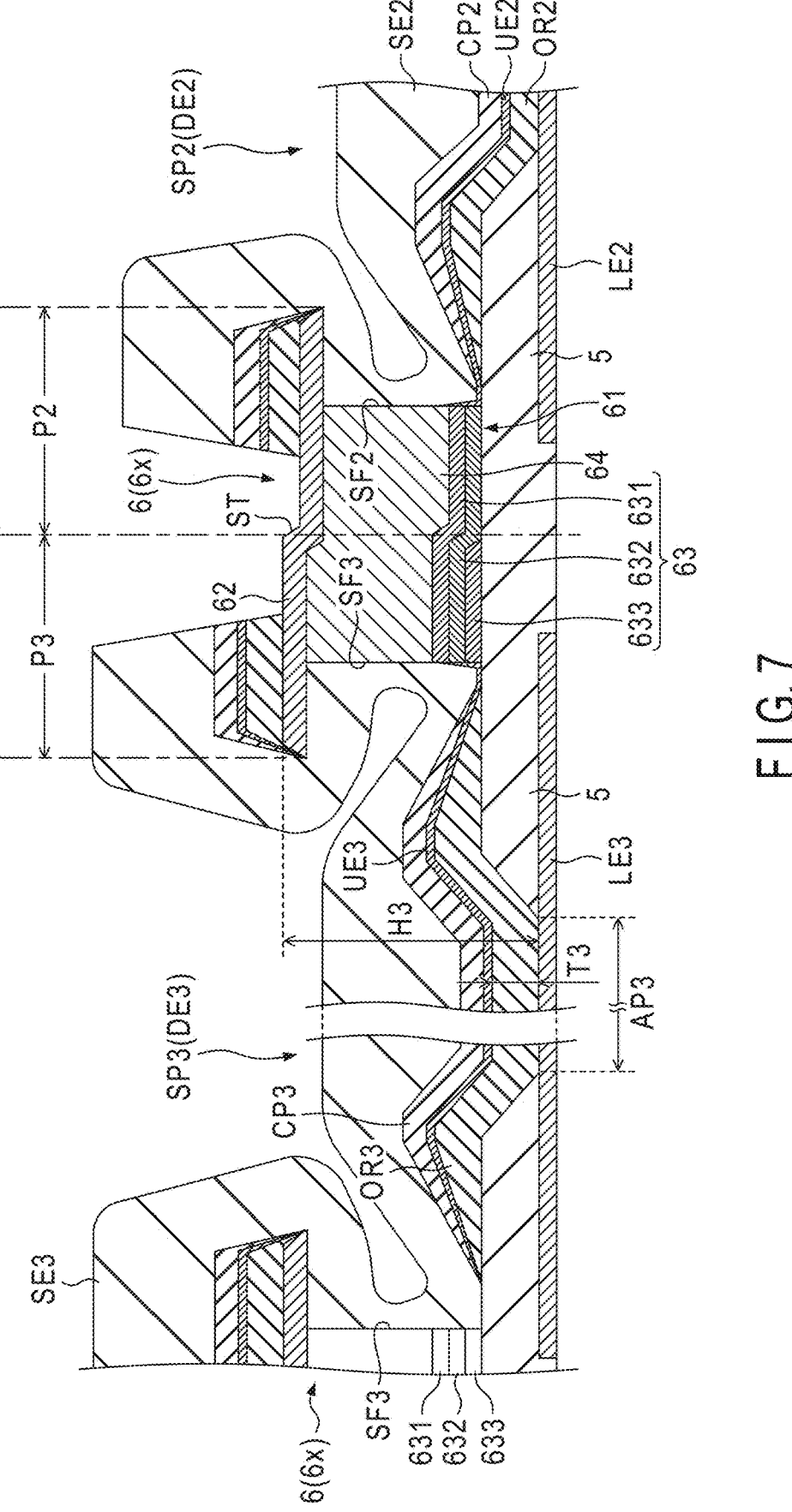
FIG. 7 is a schematic cross-sectional view of the display device along the VII-VII line of FIG. 4.

FIG. 5 is a schematic cross-sectional view of the display device DSP along the V-V line of FIG. 4, and shows subpixel SP1 and part of the partition 6 (first partition 6x) around the subpixel. FIG. 6 is a schematic cross-sectional view of the display device DSP along the VI-VI line of FIG. 4, and shows subpixel SP2 and part of the partition 6 (first partition 6x) around the subpixel. FIG. 7 is a schematic cross-sectional view of the display device DSP along the VII-VII line of FIG. 5, and shows subpixel SP3 and part of the partition 6 (first partition 6x) around the subpixel. Each of the sections of FIG. 5 to FIG. 7 is taken along the Y-Z plane. In FIG. 5 to FIG. 7, the substrate 10, the circuit layer 11, the organic insulating layer 12, the resin layer 13, the sealing layer 14 and the resin layer 15 are omitted.

As shown in FIG. 5, the lower portion 61 in the first portion P1 comprises side surfaces SF1. In the example of FIG. 5, the upper electrode UE1 is in contact with the side surface SF1 of the right partition 6 and is not in contact with the side surface SF1 of the left partition 6. The right partition 6 which is in contact with the upper electrode UE1 corresponds to the first partition 6x which overlaps the contact hole CH1 in FIG. 2.

As shown in FIG. 6, the lower portion 61 in the second portion P2 comprises a side surface SF2. In the example of FIG. 6, the upper electrode UE2 is in contact with the side surface SF2 of the left partition 6 and is not in contact with the side surface SF2 of the right partition 6. The left partition 6 which is in contact with the upper electrode UE2 corresponds to the first partition 6x which overlaps the contact hole CH2 in FIG. 2.

As shown in FIG. 7, the lower portion 61 in the third portion P3 comprises a side surface SF3. In the example of FIG. 7, the upper electrode UE3 is in contact with the side surface SF3 of the right partition 6 and is not in contact with the side surface SF3 of the left partition 6. The right partition 6 which is in contact with the upper electrode UE3 corresponds to the first partition 6x which overlaps the contact hole CH3 in FIG. 2.

As shown in FIG. 5 to FIG. 7, the organic layers OR1, OR2 and OR3 have thicknesses T1, T2 and T3, respectively. Thickness T1 corresponds to the thickness of, of the organic layer OR1, the portion which overlaps the pixel aperture AP1. Thickness T2 corresponds to the thickness of, of the organic layer OR2, the portion which overlaps the pixel aperture AP2. Thickness T3 corresponds to the thickness of, of the organic layer OR3, the portion which overlaps the pixel aperture AP3.

In the present embodiment, thicknesses T1, T2 and T3 are different from each other. Specifically, thickness T2 is greater than thickness T1, and thickness T3 is greater than thickness T2 (T1<T2<T3). Thicknesses T1, T2 and T3 are determined so as to realize a good light extraction efficiency from the display elements DE1, DE2 and DE3 based on the wavelengths of the light emitted from the organic layers OR1, OR2 and OR3. For example, when the organic layers OR1, OR2 and OR3 emit light in blue, green and red wavelength ranges, respectively, thickness T1 is 200±20 nm, and thickness T2 is 250±20 nm, and thickness T3 is 300±20 nm. These thicknesses T1, T2 and T3 can be also applied to a tandem structure in which each of the organic layers OR1, OR2 and OR3 comprises two light emitting layers.

As shown in FIG. 5, the first portion P1 of the partition 6 has height H1. Height H1 corresponds to the distance from the upper surface of the lower electrode LE1 overlapping the pixel aperture AP1 to the upper surface of the upper portion 62 in the first portion P1 in a third direction Z.

As shown in FIG. 6, the second portion P2 of the partition 6 has height H2. Height H2 corresponds to the distance from the upper surface of the lower electrode LE2 overlapping the pixel aperture AP2 to the upper surface of the upper portion 62 in the second portion P2 in the third direction Z.

As shown in FIG. 7, the third portion P3 of the partition 6 has height H3. Height H3 corresponds to the distance from the upper surface of the lower electrode LE3 overlapping the pixel aperture AP3 to the upper surface of the upper portion 62 in the third portion P3 in the third direction Z.

In the present embodiment, heights H1, H2 and H3 are different from each other. Specifically, height H2 is greater than height H1, and height H3 is greater than height H2 (H1<H2<H3). For example, the difference between heights H1 and H2 is equal to the difference between thicknesses T1 and T2. The difference between heights H2 and H3 is equal to the difference between thicknesses T2 and T3.

As shown in FIG. 5 to FIG. 7, the lower portion 61 includes a first metal layer 63 provided on the rib 5, and a second metal layer 64 provided on the first metal layer 63. The thickness of the upper portion 62 is the same in the first portion P1, the second portion P2 and the third portion P3. In addition, the thickness of the rib 6 located under each of the first portion P1, the second portion P2 and the third portion P3 is the same as each other. Thus, in the present embodiment, the difference in heights H1, H2 and H3 is generated by the difference in the thicknesses of the lower portions 61. In the example of FIG. 5 to FIG. 7, the thickness of the first metal layer 63 differs depending on the first portion P1, the second portion P2 and the third portion P3. The thickness of the second metal layer 64 is the same in the first portion P1, the second portion P2 and the third portion P3.

Specifically, the first metal layer 63 includes a first layer 631, a second layer 632 and a third layer 633. As shown in FIG. 5, the first metal layer 63 in the first portion P1 consists of the first layer 631. As shown in FIG. 6 and FIG. 7, the first metal layer 63 in the second portion P2 consists of the first layer 631 and the second layer 632. Further, the first metal layer 63 in the third portion P3 consists of the first layer 631, the second layer 632 and the third layer 633.

In the second portion P2 and the third portion P3, the second layer 632 is located between the first layer 631 and the rib 5. In the third portion P3, the third layer 633 is located between the second layer 632 and the rib 5.

As shown in FIG. 6 and FIG. 7, the step ST is formed in the upper surfaces of the second metal layer 64 and the upper portion 62 in the boundary between the second portion P2 and the third portion P3. As shown by the broken line of FIG. 4, a similar step is formed in the boundary between the first portion P1 and the second portion P2 and the boundary between the first portion P1 and the third portion P3.

The first layer 631, the second layer 632 and the third layer 633 may be formed of, for example, molybdenum (Mo). It should be noted that the first layer 631, the second layer 632 and the third layer 633 may be formed of different materials.

The second metal layer 64 may be formed of a material different from that of the first metal layer 63, for example, aluminum (Al). The second metal layer 64 may be formed of an aluminum alloy such as an aluminum-neodymium alloy (AlNd) or may comprise a multilayer structure consisting of an aluminum layer and an aluminum alloy layer.

The upper portion 62 is formed of, for example, a metal material such as titanium (Ti). The upper portion 62 may comprise a multilayer structure consisting of a metal material and a conductive oxide such as ITO. Alternatively, the upper portion 62 may be formed of an inorganic material such as silicon oxide or may comprise a multilayer structure consisting of an inorganic material and a conductive oxide such as ITO.

It should be noted that the structure of subpixel SP1, subpixel SP2 or subpixel SP3 is not limited to the examples shown in FIG. 5 to FIG. 7.

FIG. 8 is a schematic cross-sectional view showing another example of a structure which could be applied to subpixel SP1. In this example, the upper electrode UE1 is in contact with the side surfaces SF1 of the right and left partitions 6 (first partitions 6x).

The structures of subpixels SP2 and SP3 could be modified in a manner similar to that of FIG. 8. Specifically, the upper electrode UE2 may be in contact with the side surfaces SF2 of the right and left partitions 6 shown in FIG. 6. The upper electrode UE3 may be in contact with the side surfaces SF3 of the right and left partitions 6 shown in FIG. 7.

Now, this specification explains the manufacturing method of the display device DSP.

FIG. 9 is a flowchart showing an example of the manufacturing method of the display device DSP. Each of FIG. 10 to FIG. 25 is a schematic cross-sectional view showing part of the manufacturing process of the display device DSP. In FIG. 10 to FIG. 25, the substrate 10, the circuit layer 11 and the like are omitted.

To manufacture the display device DSP, first, the circuit layer 11 and the organic insulating layer 12 are formed on the substrate 10 (process PR1).

Figure 10:
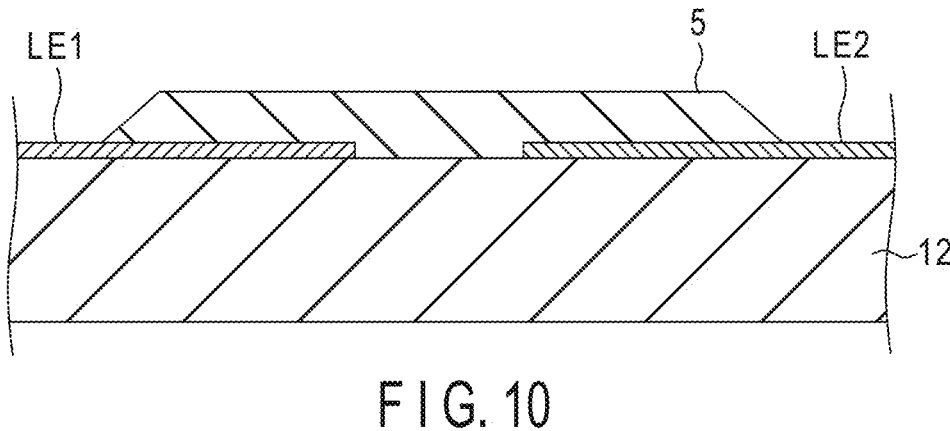
FIG. 10 is a schematic cross-sectional view showing part of the manufacturing process of the display device.

After process PR1, as shown in FIG. 10, the lower electrodes LE1, LE2 and LE3 are formed on the organic insulating layer 12 (process PR2), and the rib which covers the lower electrodes LE1, LE2 and LE3 is formed (process PR3). Subsequently, the partition 6 is formed on the rib 5 by the method shown in the example of FIG. 11 to FIG. 18 (process PR4). It should be noted that the pixel apertures AP1, AP2 and AP3 may be formed before process PR4 or may be formed after process PR4.

Figure 11:
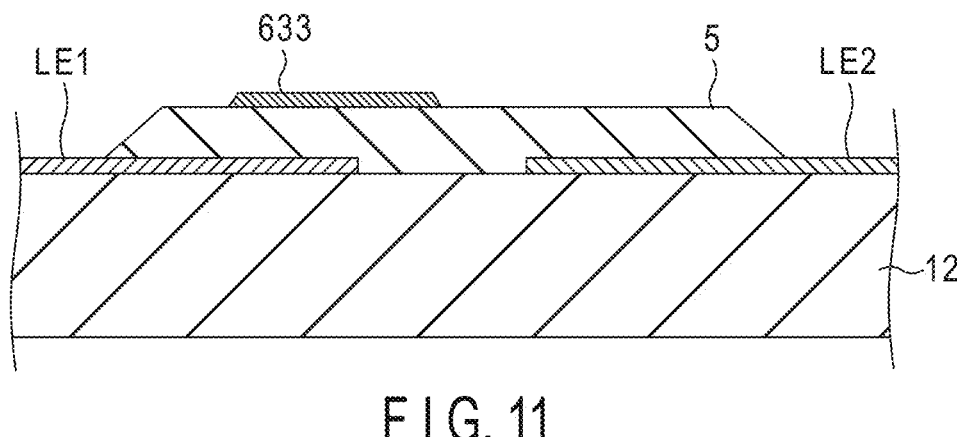
FIG. 11 is a schematic cross-sectional view showing a manufacturing process following FIG. 10.

In process PR4, first, the third layer 633 is formed on the rib 5 as shown in FIG. 11. The third layer 633 can be formed by forming a thin film which is the base of the third layer 633 in the entire substrate and patterning the thin film into a planar shape similar to that of the third portion P3.

Figure 12:
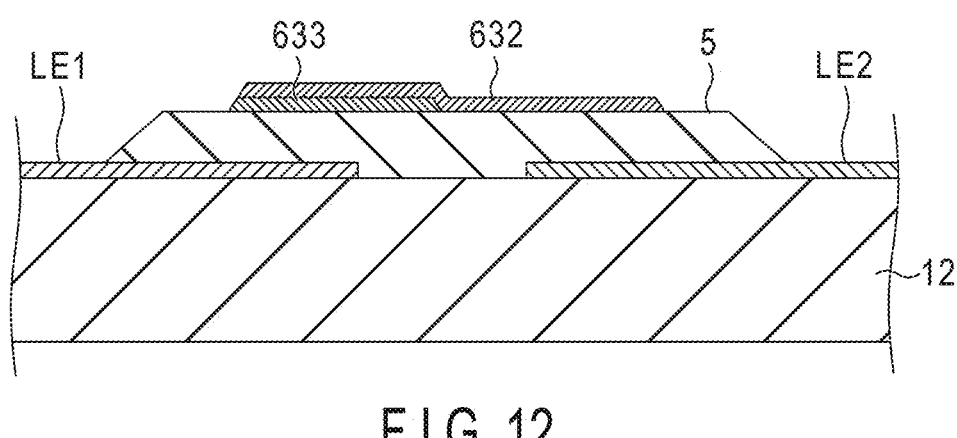
FIG. 12 is a schematic cross-sectional view showing a manufacturing process following FIG. 11.

After the formation of the third layer 633, as shown in FIG. 12, the second layer 632 is formed. The second layer 632 can be formed by forming a thin film which is the base of the second layer 632 in the entire substrate and patterning the thin film into a planar shape similar to that of the second portion P2 and the third portion P3.

After the formation of the second layer 632, as shown in FIG. 13, a thin film 631a which is the base of the first layer 631 is formed in the entire substrate. Further, as shown in FIG. 14, a thin film 64a which is the base of the second metal layer 64 is formed on the thin film 631a. A thin film 62a which is the base of the upper portion 62 is formed on the thin film 64a. A resist R1 is formed on the thin film 62a. The resist R1 has been patterned into the planar shape of the partition 6.

Figure 15:
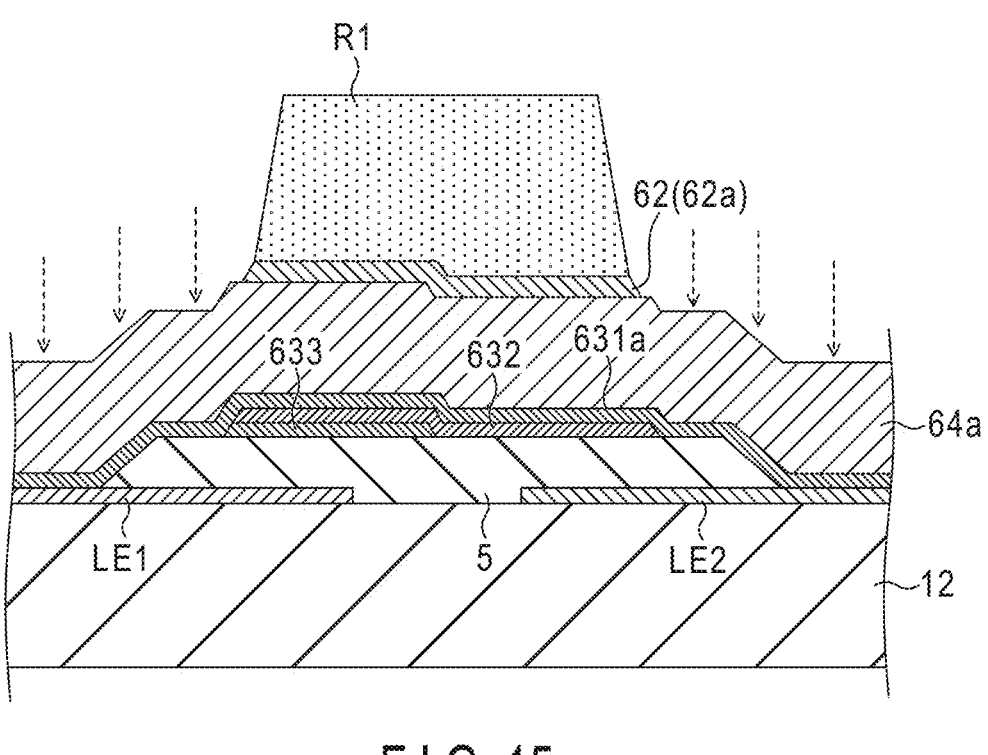
FIG. 15 is a schematic cross-sectional view showing a manufacturing process following FIG. 14.

Subsequently, as shown in FIG. 15, of the thin film 62a, the portion exposed from the resist R1 is removed by wet etching. By this process, the upper portion 62 is formed.

Figure 16:
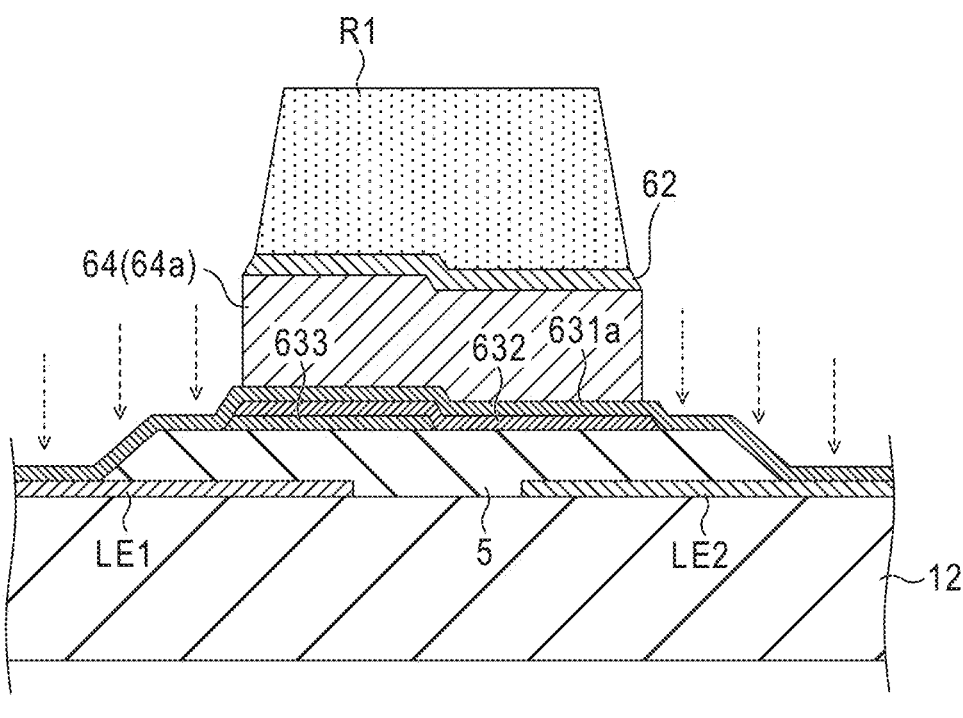
FIG. 16 is a schematic cross-sectional view showing a manufacturing process following FIG. 15.

After the formation of the upper portion 62, as shown in FIG. 16, of the thin film 64a, the portion exposed from the resist R1 is removed by anisotropic dry etching. By this process, the second metal layer 64 is formed. It should be noted that, of the second metal layer 64, the portion exposed from the resist R1 may be thinly left in the dry etching.

Figure 17:
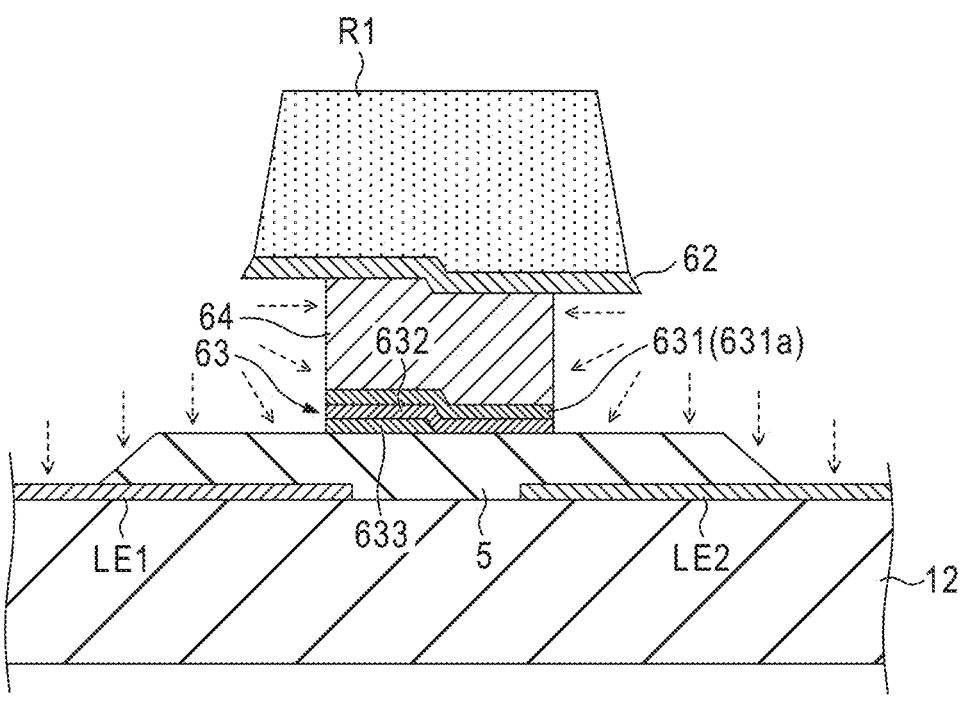
FIG. 17 is a schematic cross-sectional view showing a manufacturing process following FIG. 16.

After the formation of the second metal layer 64, as shown in FIG. 17, of the thin film 631a, the portion exposed from the resist R1 is removed by isotropic wet etching. By this process, the first metal layer 63 (the first layer 631, the second layer 632 and the third layer 633) is formed. In this wet etching, the side surfaces of the first metal layer 63 and the second metal layer 64 also corrode. In this manner, the widths of the first metal layer 63 and the second metal layer 64 are reduced relative to the upper portion 62.

Figure 18:
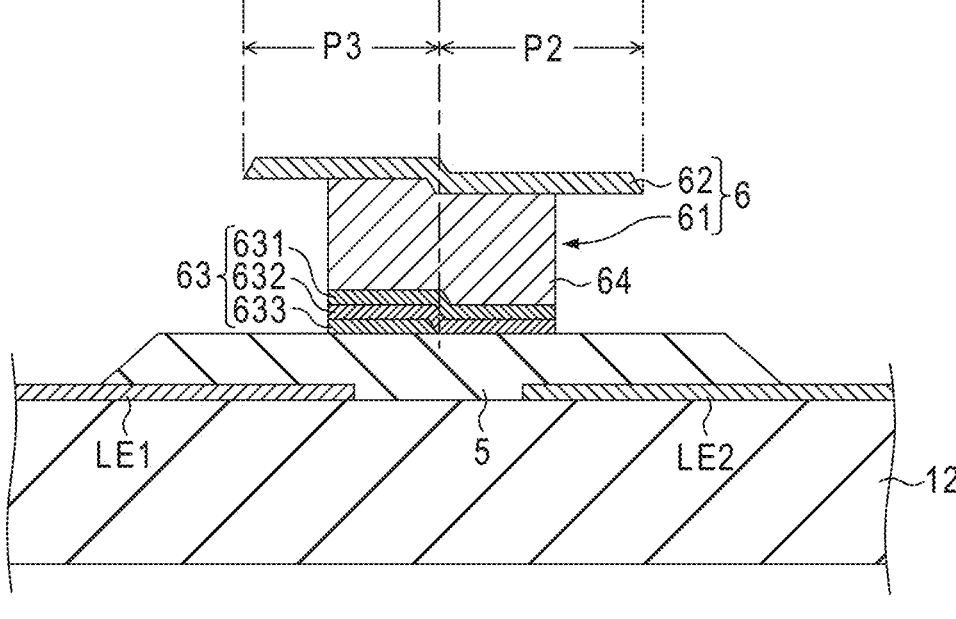
FIG. 18 is a schematic cross-sectional view showing a manufacturing process following FIG. 17.

Subsequently, the resist R1 is removed as shown in FIG. 18. By this process, the partition 6 including the lower portion 61 and the upper portion 62 and having an overhang shape is completed. In the example of FIG. 18, the right side of the partition 6 is the second portion P2 including the first layer 631 and the second layer 632, and the left side of the partition 6 is the third portion P3 including the first layer 631, the second layer 632 and the third layer 633. In addition, the first portion P1 which includes the first layer 631 and does not include the second layer 632 or the third layer 633 is formed.

After the formation of the partition 6, a process for forming the display elements DE1, DE2 and DE3 is performed. In the present embodiment, this specification assumes a case where the display element DE1 is formed firstly, and the display element DE2 is formed secondly, and the display element DE3 is formed lastly. It should be noted that the formation order of the display elements DE1, DE2 and DE3 is not limited to this example.

Figure 19:
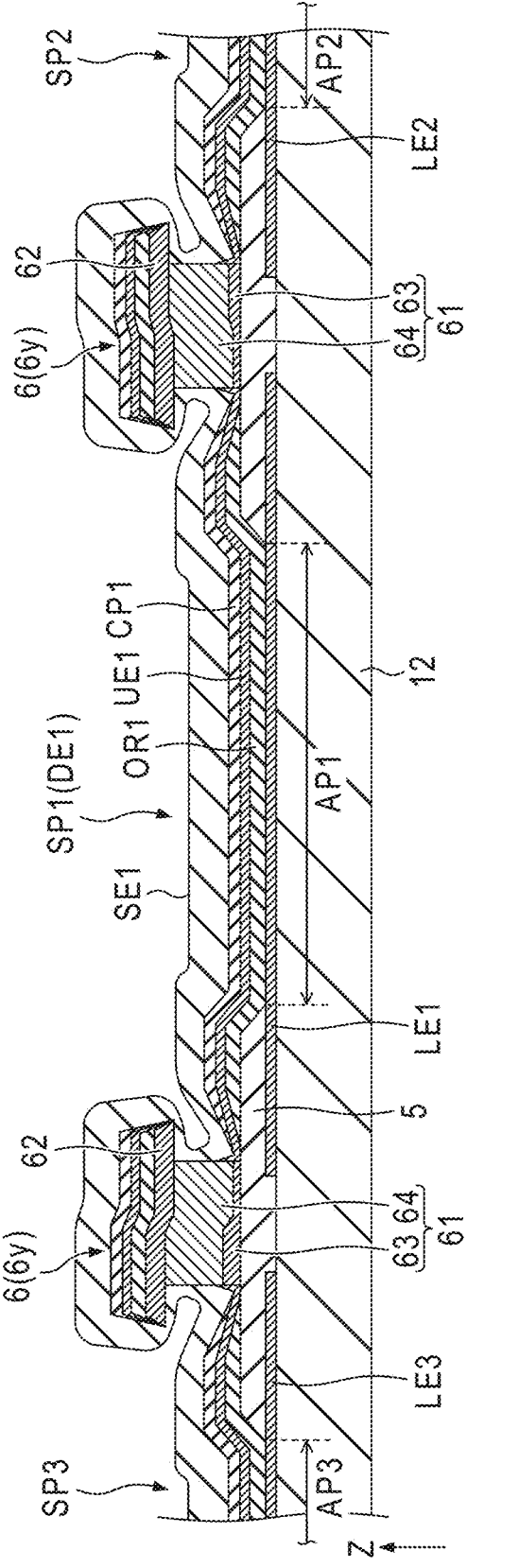
FIG. 19 is a schematic cross-sectional view showing a manufacturing process following FIG. 18.

To form the display element DE1, first, as shown in FIG. 19, the organic layer OR1 which is in contact with the lower electrode LE1 through the pixel aperture AP1, the upper electrode UE1 which covers the organic layer OR1 and the cap layer CP1 which covers the upper electrode UE1 are formed in order by vapor deposition, and further, the sealing layer SE1 which continuously covers the cap layer CP1 and the partition 6 is formed by chemical vapor deposition (CVD) (process PR5).

These organic layer OR1, upper electrode UE1, cap layer CP1 and sealing layer SE1 are formed in at least the entire display area DA and are provided in subpixels SP2 and SP3 as well as subpixel SP1. The organic layer OR1, the upper electrode UE1 and the cap layer CP1 are divided by the partition 6 having an overhang shape.

It should be noted that the section of FIG. 19 corresponds to that of FIG. 3. Each of the partitions 6 shown in FIG. 19 corresponds to the second partition 6y shown in FIG. 2. In the example of FIG. 19, the upper electrode UE1 is in contact with the side surfaces of the lower portions 61 of these second partitions 6y. Alternatively, the upper electrode UE1 may not be in contact with the lower portion 61 of one of the second partitions 6y.

As shown in FIG. 5, the upper electrode UE1 is in contact with the side surface SF1 of at least one of the first partitions 6x which are adjacent to subpixel SP1.

FIG. 20 is a schematic diagram showing an evaporation method for obtaining the structure of such a subpixel SP1. Here, for example, the figure shows the state in which the upper electrode UE1 is formed by the evaporation material M emitted from the nozzle N of an evaporation source 100. The evaporation source 100 and the substrate which is the evaporation target are relatively moved in a conveyance direction TD parallel to, for example, the second direction Y.

The evaporation material M is emitted from the nozzle N while spreading. The emission direction RD of the evaporation material M (or the extension direction of the nozzle N) inclines with respect to the third direction Z so as to face the partition 6 located on the right side of FIG. 20 (the first partition 6x which overlaps the contact hole CH1). Thus, the evaporation material M is satisfactorily attached to the side surface SF1 of the right partition 6. To the contrary, the evaporation material M which goes to the side surface SF1 of the partition 6 located on the left side of FIG. 20 is blocked by the upper portion 62. Thus, the evaporation material M is not easily attached to this side surface SF1.

It should be noted that the organic layer OR1 and the cap layer CP1 are formed by a similar evaporation method. Thus, as shown in FIG. 5, the arrangement of the organic layer OR1, the upper electrode UE1 and the cap layer CP1 is one-sided within subpixel SP1 in the Y-Z section.

When the evaporation method of FIG. 20 is used, the upper electrode UE1 is satisfactorily attached to the side surface SF1 of one of the partitions 6. In this manner, stable conduction can be assured between the upper electrode UE1 and the partition 6.

In the flowchart of FIG. 9, after process PR5, the organic layer OR1, the upper electrode UE1, the cap layer CP1 and the sealing layer SE1 are patterned (process PR6). In this patterning, as shown in FIG. 21, a resist R2 is provided on the sealing layer SE1. The resist R2 covers subpixel SP1 and part of the partition 6 around the subpixel.

Subsequently, as shown in FIG. 22, of the organic layer OR1, the upper electrode UE1, the cap layer CP1 and the sealing layer SE1, the portions exposed from the resist R2 are removed by etching using the resist R2 as a mask. For example, this etching includes wet etching and dry etching processes which are performed in order for the sealing layer SE1, the cap layer CP1, the upper electrode UE1 and the organic layer OR1.

After the process shown in FIG. 22, the resist R2 is removed. This process allows the acquisition of the following substrate. As shown in FIG. 23, in the substrate, the display element DE1 and the sealing layer SE1 are formed in subpixel SP1, and neither a display element nor a sealing layer is formed in subpixel SP2 or subpixel SP3.

The display element DE2 is formed by a procedure similar to that of the display element DE1. Specifically, after process PR6, the organic layer OR2 which is in contact with the lower electrode LE2 through the pixel aperture AP2, the upper electrode UE2 which covers the organic layer OR2 and the cap layer CP2 which covers the upper electrode UE2 are formed in order by vapor deposition, and further, the sealing layer SE2 which continuously covers the cap layer CP2 and the partition 6 is formed by CVD (process PR7). These organic layer OR2, upper electrode UE2, cap layer CP2 and sealing layer SE2 are formed in at least the entire display area DA and are provided in subpixels SP1 and SP3 as well as subpixel SP2.

The evaporation method of the organic layer OR2, the upper electrode UE2 and the cap layer CP2 is similar to the method explained with reference to FIG. 20. It should be noted that the direction of the inclination of the evaporation source 100 is the opposite direction of the example of FIG. 20. By this process, a structure similar to the structure shown in FIG. 6 can be obtained in the Y-Z section.

After process PR7, the organic layer OR2, the upper electrode UE2, the cap layer CP2 and the sealing layer SE2 are patterned by wet etching and dry etching (process PR8). The flow of this patterning is similar to that of process PR6.

Process PR8 allows the acquisition of the following substrate. As shown in FIG. 24, in the substrate, the display element DE1 and the sealing layer SE1 are formed in subpixel SP1, and the display element DE2 and the sealing layer SE2 are formed in subpixel SP2, and neither a display element nor a sealing layer is formed in subpixel SP3.

The display element DE3 is formed by a procedure similar to the procedures of the display elements DE1 and DE2. Specifically, after process PR8, the organic layer OR3 which is in contact with the lower electrode LE3 through the pixel aperture AP3, the upper electrode UE3 which covers the organic layer OR3 and the cap layer CP3 which covers the upper electrode UE3 are formed in order by vapor deposition, and further, the sealing layer SE3 which continuously covers the cap layer CP3 and the partition 6 is formed by CVD (process PR9). These organic layer OR3, upper electrode UE3, cap layer CP3 and sealing layer SE3 are formed in at least the entire display area DA and are provided in subpixels SP1 and SP2 as well as subpixel SP3.

The evaporation method of the organic layer OR3, the upper electrode UE3 and the cap layer CP3 is similar to the method explained with reference to FIG. 20. By this process, a structure similar to the structure shown in FIG. 7 can be obtained in the Y-Z section.

After process PR9, the organic layer OR3, the upper electrode UE3, the cap layer CP3 and the sealing layer SE3 are patterned by wet etching and dry etching (process PR10). The flow of this patterning is similar to the flows of processes PR6 and P8.

Process PR10 allows the acquisition of the following substrate. As shown in FIG. 25, in the substrate, the display element DE1 and the sealing layer SE1 are formed in subpixel SP1, and the display element DE2 and the sealing layer SE2 are formed in subpixel SP2, and the display element DE3 and the sealing layer SE3 are formed in subpixel SP3.

After the display elements DE1, DE2 and DE3 and the sealing layers SE1, SE2 and SE3 are formed, the resin layer 13, sealing layer 14 and resin layer 15 shown in FIG. 3 are formed in order (process PR11). By this process, the display device DSP is completed.

Here, examples of the effects obtained from the present embodiment are explained.

Figure 26:
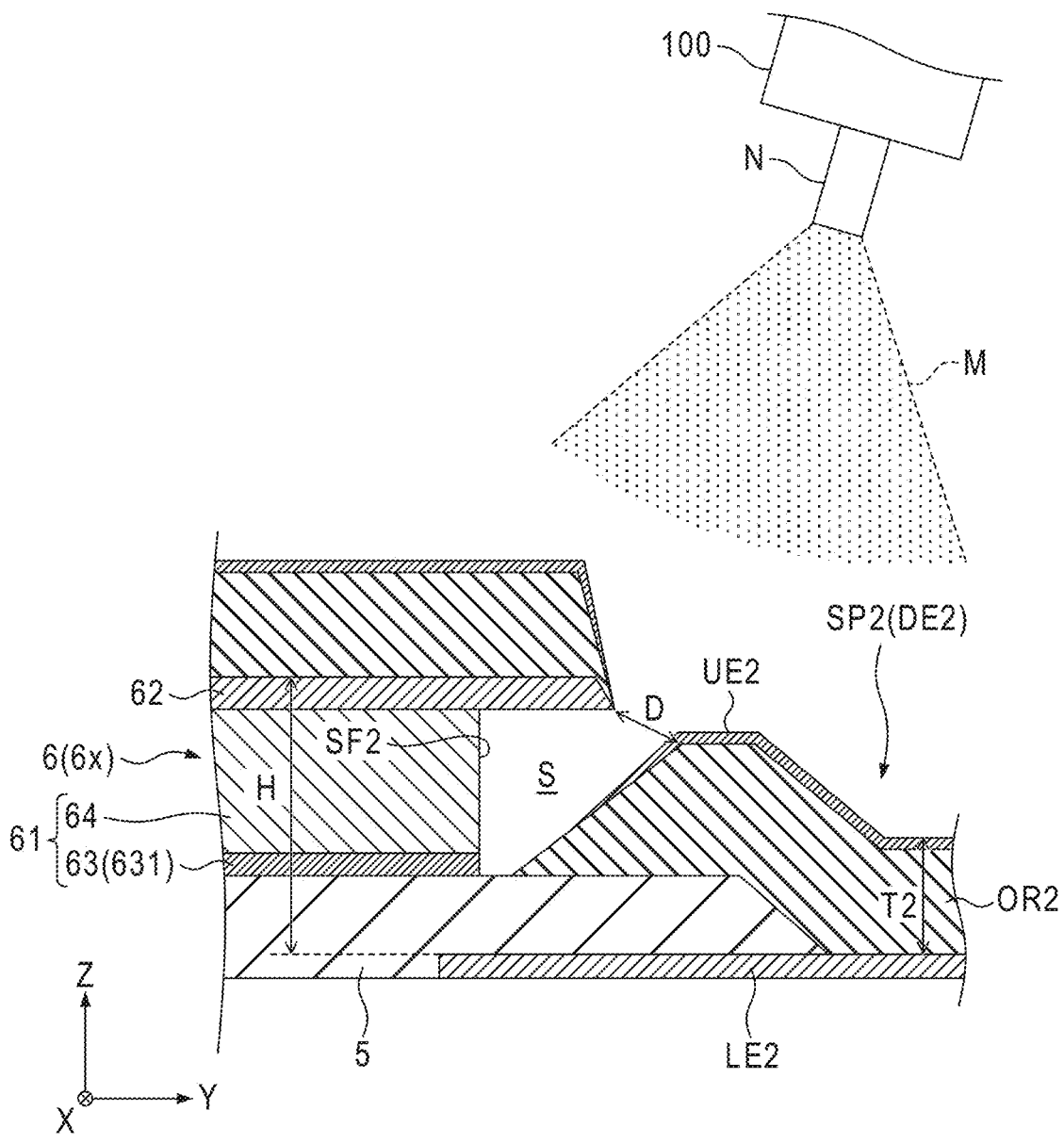
FIG. 26 is a cross-sectional view showing a comparative example of the first embodiment.

FIG. 26 is a cross-sectional view showing a comparative example of the present embodiment and shows the process of forming the upper electrode UE2 in subpixel SP2 and the partition 6 near the subpixel. In this comparative example, the lower portion 61 of the partition 6 comprises a structure similar to that of the first portion P1. In other words, the first metal layer 63 of the partition 6 comprises the first layer 631 and does not comprise the second layer 632 or the third layer 633.

As described above, the organic layer OR2 is formed so as to be thicker than the organic layer OR1. Therefore, distance D between the upper portion 62 and the organic layer OR2 is less near the partition 6. In particular, when the difference between thickness T2 of the organic layer OR2 and height H of the partition 6 is less, distance D could be considerably less. If distance D is extremely less, the evaporation material M does not easily get into the space S under the upper portion 62 when the upper electrode UE2 is deposited. Thus, there is a possibility that the upper electrode UE2 is not sufficiently in contact with the side surface SF2, thereby causing a conductive failure between the upper electrode UE2 and the partition 6.

In this regard, in the present embodiment, the partition 6 surrounding subpixel SP2 in which the thick organic layer OR2 is formed comprises the second portion P2. As the second portion P2 is higher than the first portion P1, distance D can be great. By this configuration, the evaporation material M can easily get into the space S, and the upper electrode UE2 which is satisfactorily in contact with the side surface SF2 can be formed.

It should be noted that, as the organic layer OR3 is formed so as to be further thicker than the organic layer OR2, the above problem in which distance D is less becomes more serious. In the present embodiment, the partition 6 which surrounds subpixel SP3 comprises the third portion P3 which is further higher than the second portion P2. This configuration allows the formation of the upper electrode UE3 which is satisfactorily in contact with the side surface SF3 of the third portion P3.

The configuration of the present embodiment is advantageous to shorten the time required for the manufacturing process. For example, when the thickness of the lower portion 61 of the partition 6 is made less, the processing time for forming the partition 6 including the lower portion 61 can be shortened. For example, even when the thickness of the lower portion 61 of the partition 6 is controlled so as to be less than or equal to 500 nm, a good conduction can be assured between the upper electrodes UE2 and UE3 and the partition 6 while shortening the time required for the manufacturing process by applying the configuration of the present embodiment.

As described above, in the configuration of the present embodiment, as the conductive failure between the upper electrodes UE2 and UE3 and the partition 6 is prevented, the yield of the manufacturing process of the display device DSP is improved. Various other desirable effects can be obtained from the present embodiment.

The present embodiment assumes a case where the first, second and third portions P1, P2 and P3 having different heights are provided in subpixels SP1, SP2 and SP3, respectively. As another example, the heights of, of the partition 6, the portions which surround subpixels SP1 and SP2 may be the same as each other, and only the height of the portion which surrounds subpixel SP3 may be increased. Alternatively, of the partition 6, the heights of the portions which surround subpixels SP2 and SP3 may be the same as each other.

Second Embodiment

A second embodiment is explained. Configurations similar to those of the first embodiment can be applied to portions which are not particularly referred to in the configurations of the display device DSP of the present embodiment.

Figure 27:
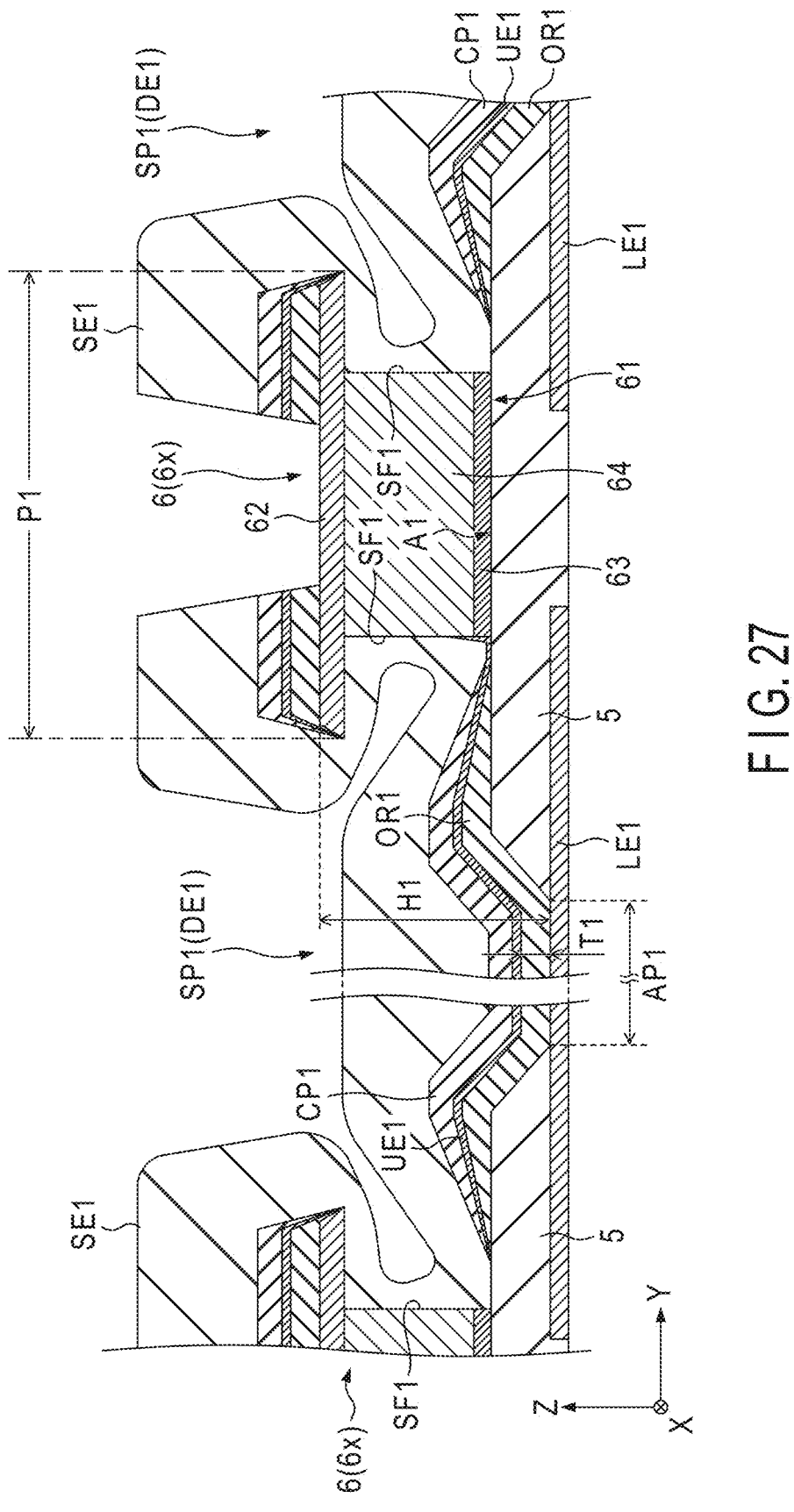
FIG. 27 is a schematic cross-sectional view showing a subpixel and a partition around the subpixel according to a second embodiment.

FIG. 27 is a schematic cross-sectional view showing subpixel SP1 and part of a partition 6 (first partition 6x) around the subpixel in the display device DSP according to the present embodiment. FIG. 28 is a schematic cross-sectional view showing subpixel SP2 and part of the partition 6 (first partition 6x) around the subpixel in the display device DSP according to the present embodiment. FIG. 29 is a schematic cross-sectional view showing subpixel SP3 and part of the partition 6 (first partition 6x) around the subpixel in the display device DSP according to the present embodiment. Each of these cross-sectional views is taken along the Y-Z plane. In FIG. 27 to FIG. 29, a substrate 10, a circuit layer 11, an organic insulating layer 12, a resin layer 13, a sealing layer 14 and a resin layer 15 are omitted.

In the display device DSP of the present embodiment, the partition 6 includes, in a manner similar to that of the first embodiment, a first portion P1 having height H1, a second portion P2 having height H2 and a third portion P3 having height H3. For example, the first portion P1, the second portion P2 and the third portion P3 have the planar shapes shown in FIG. 4. However, the shapes are not limited to this example.

The configuration of subpixel SP1 and first portion P1 shown in FIG. 27 is similar to the configuration shown in FIG. 5. However, as shown in FIG. 28 and FIG. 29, the first metal layer 63 of each of the second portion P2 and the third portion P3 has the same thickness as the first metal layer 63 of the first portion P1. Thus, the thicknesses of the first portion P1, the second portion P2 and the third portion P3 are equal to each other.

In the present embodiment, the difference in the heights of the first portion P1, the second portion P2 and the third portion P3 is realized mainly by the raising layer 7 shown in FIG. 28 and FIG. 29. The raising layer 7 is located under the second portion P2, the third portion P3 and a rib 5. In the example of FIG. 28 and FIG. 29, the end portions of lower electrodes LE2 and LE3 are located between the raising layer 7 and the rib 5.

The raising layer 7 has thickness Ta under the second portion P2, and has thickness Tb under the third portion P3. Thickness Tb is greater than thickness Ta (Ta<Tb). In the example of FIG. 27, the raising layer 7 is not provided under the first portion P1. Alternatively, the raising layer 7 which has a thickness less than thicknesses Ta and Tb may be provided under the first portion P1.

The upper surface of the rib 5 comprises an area A1 in which the first portion P1 is provided, an area A2 in which the second portion P2 is provided, and an area A3 in which the third portion P3 is provided. As the raising layer 7 is provided under the areas A2 and A3, these areas A2 and A3 are formed at positions which are higher than the area A1 in a third direction Z. Further, since the raising layer 7 is thick under the area A3, the area A3 is formed at a position which is higher than the area A2 in the third direction Z. Because of this difference in the heights of the areas A1, A2 and A3, in a manner similar to that of the first embodiment, the relationship of H1<H2<H3 is established among heights H1, H2 and H3 of the first portion P1, the second portion P2 and the third portion P3.

As shown in FIG. 28 and FIG. 29, a step ST1 is formed on the upper surface of the rib 5 in the boundary between the areas A2 and A3. A step ST2 is formed on the upper surface of an upper portion 62 in the boundary between the second portion P2 and the third portion P3. Although not shown in the sections of FIG. 27 to FIG. 29, similar steps are generated in the boundary between the area A1 and the area A2, the boundary between the area A1 and the area A3, the boundary between the first portion P1 and the second portion P2 and the boundary between the first portion P1 and the third portion P3.

Since the raising layer 7 is provided, an inclined surface Fa which descends toward a pixel aperture AP2 is formed on the upper surface of the rib between the second portion P2 and the pixel aperture AP2. An inclined surface Fb which descends toward a pixel aperture AP3 is formed on the upper surface of the rib 5 between the third portion P3 and the pixel aperture AP3. As the raising layer 7 located under the third portion P3 is thick, the inclined surface Fb inclines at an angle which is steeper than the inclined surface Fa. For example, the inclined surface Fa overlaps the upper portion 62 in the second portion P2 in the third direction Z. The inclined surface Fb overlaps the upper portion 62 in the third portion P3 in the third direction Z.

In a case where the inclined surface Fa is formed, even if a thick organic layer OR2 is provided on the inclined surface Fa, the distance between the organic layer OR2 and the upper portion 62 is great. Similarly, in a case where the inclined surface Fb is formed, even if a thick organic layer OR3 is provided on the inclined surface Fb, the distance between the organic layer OR3 and the upper portion 62 is great. In a manner similar to that of the first embodiment, this configuration allows the formation of upper electrodes UE2 and UE3 which are satisfactorily in contact with side surfaces SF2 and SF3, respectively, by vapor deposition.

For example, the raising layer 7 is provided on the organic insulating layer 12 shown in FIG. 3. The raising layer 7 can be formed of the same insulating organic material as the organic insulating layer 12, or the same insulating inorganic material as the rib 5.

For example, the portion with thickness Ta and the portion with thickness Tb may be formed by using a halftone mask for the exposure of a resist in a photolithographic process for patterning the raising layer 7. Alternatively, the portion with thickness Ta and the portion with thickness Tb may be formed by forming the raising layer 7 so as to comprise a multilayer structure and partly differentiating the number of insulating layers to be stacked.

The raising layer 7 may be part of the organic insulating layer 12. In other words, a portion in which the raising layer 7 is not present, a portion with thickness Ta and a portion with thickness Tb may be formed by using a multi-tone mask for the exposure of a resist in a photolithographic process for forming the organic insulating layer 12.

The configuration of the present embodiment can be combined with that of the first embodiment. In other words, the difference in the heights of the first portion P1, the second portion P2 and the third portion P3 may be realized by the difference in the thicknesses of the raising layer 7 and the first metal layer 63.

Third Embodiment

A third embodiment is explained. Configurations similar to those of the first embodiment or the second embodiment can be applied to portions which are not particularly referred to in the configurations of the display device DSP of the present embodiment.

Figure 30:
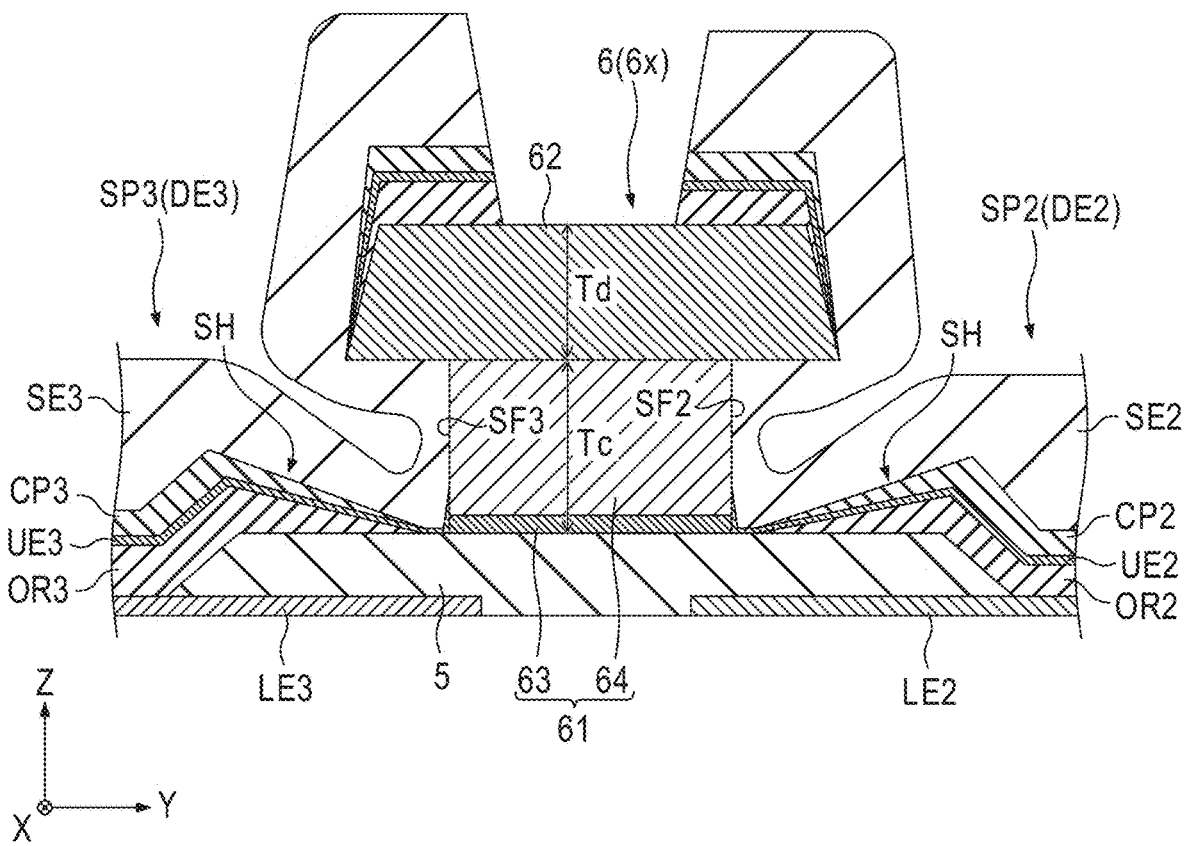
FIG. 30 is a schematic cross-sectional view showing a partition according to a third embodiment.

FIG. 30 is a schematic cross-sectional view showing subpixels SP2 and SP3 and part of a partition 6 (first partition 6x) between subpixels SP2 and SP3 in the display device DSP according to the present embodiment. In the present embodiment, the partition 6 does not have the difference caused by the first, second and third portions P1, P2 and P3, and has a uniform height. However, an upper portion 62 is formed so as to be thicker than the upper portions 62 shown in the first embodiment and the second embodiment.

A lower portion 61 has thickness Tc, and the upper portion 62 has thickness Td. Thickness Td should be preferably greater than or equal to 30% of thickness Tc but less than or equal to 100% of thickness Tc. For example, thickness Tc is greater than or equal to 300 nm but less than or equal to 500 nm, and thickness Td is greater than or equal to 150 nm but less than or equal to 300 nm.

When organic layers OR1, OR2 and OR3 are deposited, as shown in FIG. 20, an evaporation material is emitted from an evaporation source while spreading. Thus, a shadow area SH in which the amount of the attachment of the evaporation material is reduced because of the shadow of the upper portion 62 is formed near the partition 6. In the shadow area SH, the thicknesses of the organic layers OR1, OR2 and OR3 decrease toward the partition 6.

The width of this shadow area SH is increased by forming the upper portion 62 so as to be thick. Thus, even when, for example, the thick organic layers OR2 and OR3 are formed, the distance between the shadow areas SH of the organic layers OR2 and OR3 and the upper portion 62 is great. In a manner similar to that of the first embodiment and the second embodiment, this configuration allows the formation of upper electrodes UE2 and UE3 which are satisfactorily in contact with side surfaces SF2 and SF3, respectively.

The configuration of the present embodiment can be combined with the configurations of the first and second embodiments. Specifically, the partition 6 may comprise the first, second and third portions P1, P2 and P3 having different heights, and the upper portion 62 in these portions may be formed so as to be thick.

All of the display devices and manufacturing methods thereof that can be implemented by a person of ordinary skill in the art through arbitrary design changes to the display device and manufacturing method thereof described above as the embodiments of the present invention come within the scope of the present invention as long as they are in keeping with the spirit of the present invention.

Various modification examples which may be conceived by a person of ordinary skill in the art in the scope of the idea of the present invention will also fall within the scope of the invention. For example, even if a person of ordinary skill in the art arbitrarily modifies the above embodiments by adding or deleting a structural element or changing the design of a structural element, or adding or omitting a step or changing the condition of a step, all of the modifications fall within the scope of the present invention as long as they are in keeping with the spirit of the invention.

Further, other effects which may be obtained from each embodiment and are self-explanatory from the descriptions of the specification or can be arbitrarily conceived by a person of ordinary skill in the art are considered as the effects of the present invention as a matter of course.

What is claimed is:

1. A display device comprising:

a first lower electrode;

a second lower electrode;

a rib comprising a first pixel aperture which overlaps the first lower electrode, and a second pixel aperture which overlaps the second lower electrode;

a first organic layer which covers the first lower electrode through the first pixel aperture and emits light based on application of voltage;

a second organic layer which covers the second lower electrode through the second pixel aperture and emits light based application of voltage;

a first upper electrode which covers the first organic layer;

a second upper electrode which covers the second organic layer; and a partition including a lower portion which is provided on the rib between the first pixel aperture and the second pixel aperture, and an upper portion which protrudes from a side surface of the lower portion, wherein the partition comprises a first portion on the first pixel aperture side, and a second portion on the second pixel aperture side, and a first height from an upper surface of the first lower electrode overlapping the first pixel aperture to an upper surface of the first portion is different from a second height from an upper surface of the second lower electrode overlapping the second pixel aperture to an upper surface of the second portion.

2. The display device of claim 1, wherein the second organic layer is thicker than the first organic layer, and the second height is greater than the first height.

3. The display device of claim 1, wherein the first upper electrode is in contact with a first side surface of the lower portion included in the first portion, and the second upper electrode is in contact with a second side surface of the lower portion included in the second portion.

4. The display device of claim 1, wherein a step is formed in the upper portion in a boundary between the first portion and the second portion.

5. The display device of claim 1, wherein a thickness of the lower portion differs between the first portion and the second portion.

6. The display device of claim 5, wherein the lower portion includes a first metal layer, and a second metal layer formed of a metal material difference from the first metal layer and provided on the first metal layer, and a thickness of the first metal layer differs between the first portion and the second portion.

7. The display device of claim 1, further comprising a raising layer located under the second portion and the rib, wherein an upper surface of the rib comprises a first area in which the first portion is provided, and a second area in which the second portion is provided, and the second area is formed at a position which is higher than the first area by the raising layer.

8. The display device of claim 7, wherein an inclined surface which descends toward the second pixel aperture is formed on the upper surface of the rib between the second portion and the second pixel aperture by the raising layer.

9. The display device of claim 1, wherein the first portion surrounds the first pixel aperture, and the second portion surrounds the second pixel aperture.

10. The display device of claim 9, further comprising:

a third lower electrode;

a third organic layer which covers the third lower electrode through a third pixel aperture provided in the rib and emits light based on application of voltage; and a third upper electrode which covers the third organic layer, wherein the partition further comprises a third portion which surrounds the third pixel aperture, and a third height from an upper surface of the third lower electrode overlapping the third pixel aperture to an upper surface of the third portion is different from the first height and the second height.

11. A display device comprising:

a substrate;

a first lower electrode and a second lower electrode overlapping the substrate in a plan view;

a rib formed of an inorganic insulating material, the rib provided on the first lower electrode and the second lower electrode and including a first pixel aperture overlapping the first lower electrode in the plan view, and a second pixel aperture overlapping the second lower electrode in the plan view; and a partition on the rib and between the first pixel aperture and the second pixel aperture, the partition including a lower portion provided on the rib, and an upper portion provided on the lower portion and extending beyond a side surface of the lower portion, wherein the lower portion of the partition includes a first bottom layer on the rib and formed of a first conductive material, a second bottom layer on the first bottom layer and formed of a second conductive material, and an axis layer provided above the second bottom layer, the first bottom layer includes a first edge and a second edge, the first edge being closer to the first pixel aperture compared to the second edge, and the second bottom layer completely covers the first edge of the first bottom layer.

12. The display device according to claim 11, further comprising:

a first organic layer on the rib and in contact with the first lower electrode at the first pixel aperture, the first organic layer including a first light emitting layer and having a first maximum thickness in a Z direction, which is a direction normal to an upper surface of the substrate, inside the first pixel aperture; and a second organic layer on the rib and in contact with the second lower electrode at the second pixel aperture, the second organic layer including a second light emitting layer and having a second maximum thickness in the Z direction inside the second pixel aperture, wherein the first light emitting layer emits a first color light, the second light emitting layer emits a second color light different from the first color light, and the second maximum thickness is greater than the first maximum thickness.

13. The display device according to claim 12, further comprising:

a first upper electrode on the first organic layer; and a second upper electrode on the second organic layer, wherein the first upper electrode and the second upper electrode are in contact with the side surface of the lower portion of the partition.

14. The display device according to claim 13, wherein
the side surface of the lower portion of the partition includes
a first side surface, and
a second side surface opposite to the first side surface,
the first upper electrode is in contact with the first side surface of the lower portion of the partition, and
the second upper electrode is in contact with the second side surface of the lower portion of the partition.

15. The display device according to claim 13, further comprising:
a first cap layer on the first upper electrode; and
a second cap layer on the second upper electrode.

16. The display device according to claim 14, further comprising:
a first sealing layer above the first upper electrode; and
a second sealing layer above the second upper electrode, wherein
the first sealing layer continuously covering the first upper electrode, the first side surface of the lower portion of the partition and the upper portion of the partition, and the second sealing layer continuously covering the second upper electrode, the second side surface of the lower portion of the partition and the upper portion of the partition.

17. The display device according to claim 16, further comprising:
a first cap layer between the first upper electrode and the first sealing layer; and
a second cap layer between the second upper electrode and the second sealing layer, wherein
the first sealing layer continuously covering the first cap layer, the first side surface of the lower portion of the partition and the upper portion of the partition, and
the second sealing layer continuously covering the second cap layer, the second side surface of the lower portion of the partition and the upper portion of the partition.

18. The display device according to claim 11, wherein
the first conductive material is equal to the second conduct material.

19. The display device according to claim 11, wherein
the first conductive material is different from the second conduct material.

* * * * *